(12) United States Patent  (10) Patent No.: US 9,040,176 B2
Kim et al.  (45) Date of Patent: May 26, 2015

(54) ORGANIC LIGHT-EMITTING DEVICE

(71) Applicant: SAMSUNG DISPLAY CO., LTD., Yongin, Gyeonggi-do (KR)

(72) Inventors: Nam-Jin Kim, Yongin (KR); Chul-Hwan Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 254 days.

(21) Appl. No.: 13/830,107

(22) Filed: Mar. 14, 2013

(65) Prior Publication Data

US 2014/0145154 A1   May 29, 2014

(30) Foreign Application Priority Data

Nov. 23, 2012  (KR) .................. 10-2012-0133937

(51) Int. Cl.
  *H01L 51/50*  (2006.01)
  *H01L 51/52*  (2006.01)

(52) U.S. Cl.
  CPC ......... *H01L 51/5256* (2013.01); *Y10S 428/917* (2013.01)

(58) Field of Classification Search
  None
  See application file for complete search history.

(56) References Cited

U.S. PATENT DOCUMENTS 7,902,567 B2   3/2011  Oh et al.
2004/0170861 A1*  9/2004  Culligan et al. .............. 428/690

(Continued)

FOREIGN PATENT DOCUMENTS

JP  2010-160300  *  7/2010 .............. C08F 20/26
JP  2012-117079    6/2012

(Continued)

OTHER PUBLICATIONS

KIPO Registration Determination Certificate dated Nov. 17, 2014, for Korean priority Patent application 10-2012-0133937, (6 pages).

(Continued)

*Primary Examiner* — Gregory Clark
(74) *Attorney, Agent, or Firm* — Christie, Parker & Hale, LLP

(57) ABSTRACT

An organic light-emitting device including: a substrate; a display unit on the substrate; and an encapsulation layer covering the display unit, the encapsulation layer having an alternating stack structure of an organic layer and an inorganic layer, and the organic layer including a polymer polymerized from monomers of Formula 1 and Formula 2:

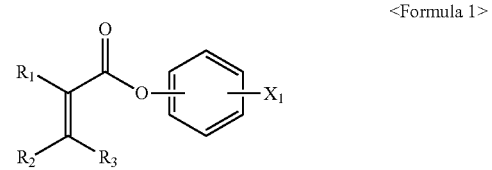

<Formula 1>

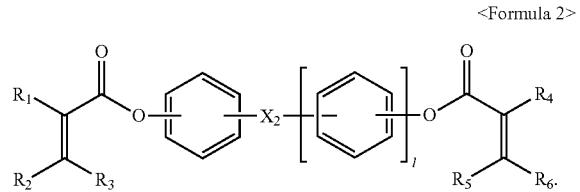

<Formula 2>

20 Claims, 1 Drawing Sheet

(56) References Cited

U.S. PATENT DOCUMENTS

| | | |
|---|---|---|
| 2006/0012296 A1 | 1/2006 | Eida et al. |
| 2009/0035486 A1* | 2/2009 | Shin |
| 2009/0127544 A1* | 5/2009 | Schrodner et al. ............... 257/40 |
| 2010/0157585 A1* | 6/2010 | Diekmann et al. ............ 362/228 |
| 2012/0146492 A1 | 6/2012 | Ryu et al. |
| 2012/0305982 A1 | 12/2012 | Takebe et al. |

FOREIGN PATENT DOCUMENTS

| | | |
|---|---|---|
| JP | 5149487 B2 | 2/2013 |
| KR | 10-2004-0039608 A | 5/2004 |
| KR | 10-2005-0051699 A | 6/2005 |
| KR | 10-0682963 B1 | 2/2007 |
| KR | 10-2009-0012513 | 2/2009 |
| KR | 10-2012-0065049 | 6/2012 |

OTHER PUBLICATIONS

Patent Abstracts of Japan for Japanese Publication 2007-224117 dated Sep. 6, 2007, corresponding to Japanese Patent 5149487 dated Feb. 20, 2013 listed above, (1 page).

\* cited by examiner

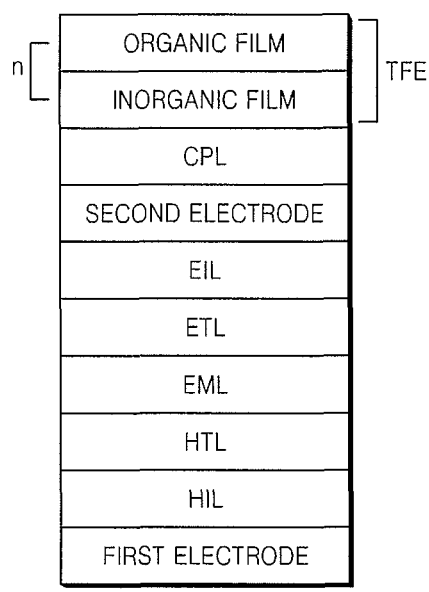

ORGANIC LIGHT-EMITTING DEVICE

CROSS-REFERENCE TO RELATED PATENT APPLICATION

This application claims priority to and the benefit of Korean Patent Application No. 10-2012-0133937, filed on Nov. 23, 2012, in the Korean Intellectual Property Office, the disclosure of which is incorporated herein in its entirety by reference.

BACKGROUND

1. Field

The following description relates to an organic light-emitting device.

2. Description of the Related Art

Organic light-emitting devices (OLEDs), which are self-emitting devices, have advantages such as wide viewing angles, excellent contrast, quick response, high brightness, and excellent driving voltage characteristics, and can provide multicolored images.

A typical OLED has a structure including a substrate, an anode, a hole transport layer (HTL), an emission layer (EML), an electron transport layer (ETL), and a cathode which are sequentially stacked on the substrate. The HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons (carriers) recombine in the organic EML to generate excitons. When the excitons drop (e.g., transition) from an excited state to a ground state, light is emitted.

Since OLEDs are composed of organic materials, when they are combined with water molecules and oxygen, the characteristics of organic materials may deteriorate. Accordingly, encapsulation technology is used to prevent or reduce permeation of water molecules and oxygen into OLEDs.

SUMMARY

Aspects of embodiments of the present invention provide an organic light-emitting device having a far lesser number of dark spots occurring due to oxidation of a cathode, as compared to other OLEDs.

According to an embodiment of the present invention, an organic light-emitting device includes: a substrate; a display unit on the substrate; and an encapsulation layer covering the display unit, the encapsulation layer having an alternating stack structure of an organic layer and an inorganic layer, and the organic layer including a polymer polymerized from monomers of Formula 1 and Formula 2 below:

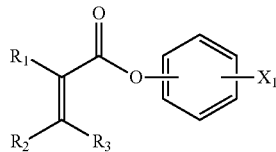

<Formula 1>

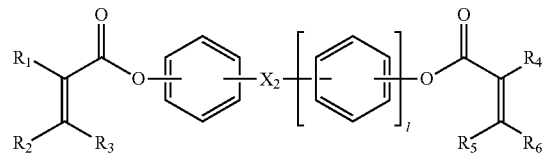

<Formula 2> in Formulae 1 and 2, $R_1$ to $R_6$ are each independently a hydrogen atom, a deuterium atom, or a C1-10 alkyl group, $X_1$ is a C1 to C30 alkyl group, a C6 to C20 aromatic ring-containing C1 to C30 alkyl group, or C6 to C20 cyclicalkyl ring-containing C1 to C30 alkyl group, $X_2$ is a C1 to C30 alkylene group, a C6 to C20 aromatic ring-containing C1 to C30 alkylene group, or C6 to C20 cyclicalkyl ring-containing C1 to C30 alkylene group, and $l$ is 0 or 1.

According to another embodiment of the present invention, a flat panel display device includes the above-described organic light-emitting device, which includes a first electrode that is electrically connected to a source or drain electrode of a thin film transistor.

BRIEF DESCRIPTION OF THE DRAWINGS

The above and other features and advantages of the present invention will become more apparent by describing in detail exemplary embodiments thereof with reference to the accompanying drawing. Here, the accompanying drawing is a cross-sectional view of the structure of an organic light-emitting device according to an embodiment of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Expressions such as "at least one of," when preceding a list of elements, modify the entire list of elements and do not modify the individual elements of the list.

An organic light-emitting device (OLED) according to an embodiment of the present invention includes: a substrate; a display unit on the substrate; and an encapsulation layer covering the display unit, wherein the encapsulation layer has an alternating stack structure of an organic layer and an inorganic layer, and the organic layer includes a polymer of monomers of Formula 1 and Formula 2 below:

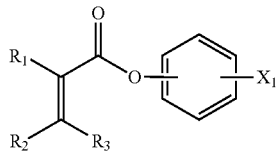

<Formula 1>

-continued

<Formula 2>

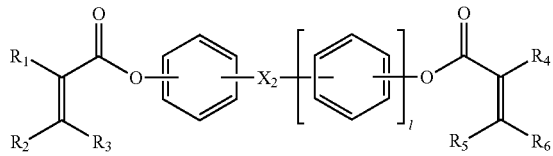

in Formulae 1 and 2, $R_1$ to $R_6$ are each independently a hydrogen atom, a deuterium atom, or a C1-10 alkyl group, $X_1$ is a C1 to C30 alkyl group, a C6 to C20 aromatic ring-containing C1 to C30 alkyl group (e.g., a C1 to C30 alkyl group including a C6 to C20 aromatic ring), or C6 to C20 cyclicalkyl ring-containing C1 to C30 alkyl group (e.g., a C1 to C30 alkyl group including a C6 to C20 cycloalkyl group), $X_2$ is a C1 to C30 alkylene group, a C6 to C20 aromatic ring-containing C1 to C30 alkylene group (e.g., a C1 to C30 alkylene group including a C6 to C20 aromatic ring), or C6 to C20 cyclicalkyl ring-containing C1 to C30 alkylene group (e.g., a C1 to C30 alkylene group including a C6 to C20 cycloalkyl group), and l is 0 or 1.

OLEDs can be protected from water molecules and oxygen by gas encapsulation or metal-can encapsulation (e.g., gas encapsulation or metal-can encapsulation can reduce the amount of water molecules and oxygen that enter into the OLED). For example, thin film encapsulation (TFE) technology is useful for encapsulating a flexible OLED or thin OLED. Since the TFE should have a water vapor transmission rate (WVTR) of $10^{-6}$ g/m²/day or less, which is useful for OLEDs, in general, an inorganic material and an organic material are repeatedly stacked to form the TFE. When an inorganic film and an organic film are stacked, an inorganic film can be formed using a plasma process. As a result of the plasma process, the organic film is damaged and the plasma may diffuse into an underlying film, thereby causing defects.

As a material for an organic film for TFE, acrylates based on an aliphatic chain are mainly used, and a light hardening agent is added to such acrylate materials, which are exposed to UV light to form a light hardened product. An inorganic film is stacked on the light hardened product, and a method of forming an inorganic film uses plasma. In this regard, the light hardened product is damaged by plasma. Various radicals, electrons, ion bombardment, which are generated or occur when plasma is used, damage the light hardened product, and when the light hardened product is damaged, outgas may be generated from the light hardened product, which may then diffuse into an underlying film. During reliability tests, a cathode is oxidized due to the outgas, and ultimately, dark spots occur.

Even when silicon-containing acrylate is introduced to an aliphatic chain-based acrylate material, transmission of outgas is not prevented.

The monomers of Formulae 1 to 3 used to polymerize an organic layer of an encapsulation layer of the organic light-emitting device may contribute to a decrease in the plasma damage due to the presence of a phenyl ring in Formulae 1 to 3, and due to the presence of chains $X_1$ to $X_5$ of Formulae 1 to 3, packing is enhanced and gas transmissibility decrease.

According to an embodiment of the present invention, $R_1$ to $R_6$ may each independently be a hydrogen atom, a deuterium atom, or methyl.

According to an embodiment of the present invention, $X_1$ may be represented by any one of Formulae 2a to 2e below:

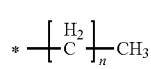

2a

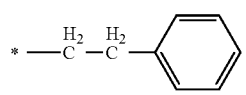

2b

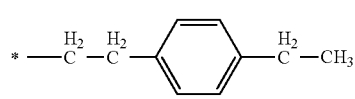

2c

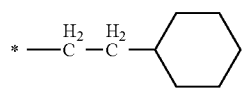

2d

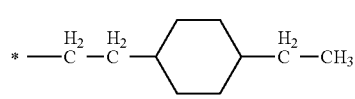

2e wherein n is an integer in a range of 1 to 12, and * represents a bonding site.

According to an embodiment of the present invention, $X_2$ may be represented by any one of Formulae 3a to 3e below:

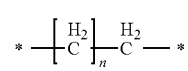

3a

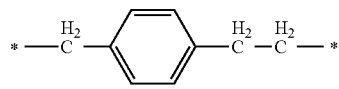

3b

3c

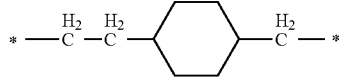

3d

3e wherein n is an integer of 1 to 12, and * represents a bonding site.

According to an embodiment of the present invention, the organic layer may be an organic layer including a polymer polymerized using a monomer represented by Formula 3.

<Formula 3>

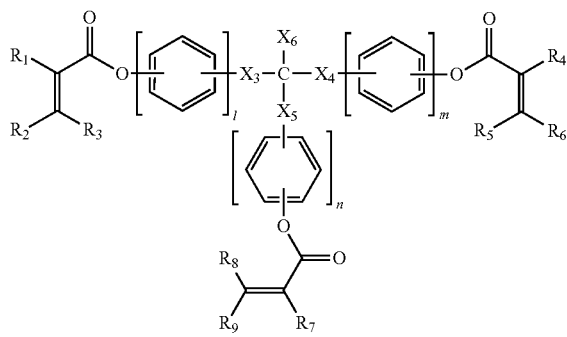

In Formula 3, $R_1$ to $R_8$ may each independently be a hydrogen atom, a deuterium atom, or a C1-10 alkyl group, $X_3$ to $X_5$ may each independently be a C1 to C30 alkylene group, a C6 to C20 aromatic ring-containing C1 to C30 alkylene group (e.g., a C1 to C30 alkylene group including a C6 to C20 aromatic ring), or a C6 to C20 cyclicalkyl ring-containing C1 to C30 alkylene group (e.g., a C1 to C30 alkylene group including a C6 to C20 cycloalkyl group), $X_6$ is a hydrogen atom, or a C1 to C30 alkyl group, and l, m, and n are each independently 0 or 1.

According to an embodiment of the present invention, $R_1$ to $R_8$ may each independently be a hydrogen atom, a deuterium atom, or methyl.

According to an embodiment of the present invention, $X_3$ to $X_5$ may each independently be represented by any one of Formulae 3a to 3h.

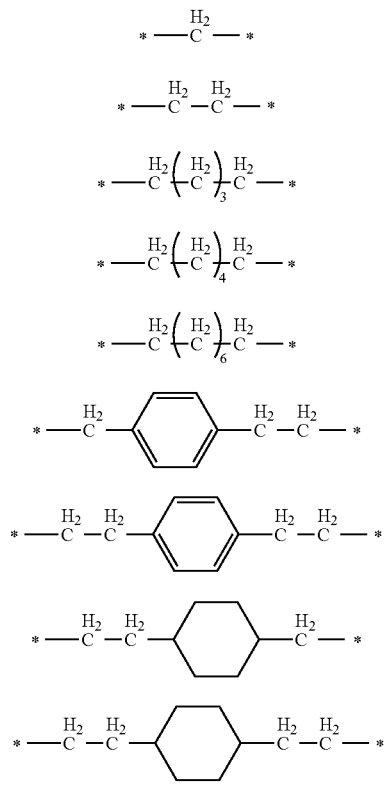

In the formulae above, * represents a bonding site.

The monomer of Formula 3 may be, for example, a compound represented by Formula 4 below, that is, trimethylolpropane triacrylate (TMPTA).

<Formula 4>

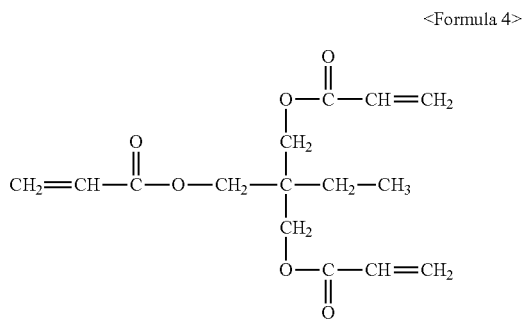 [SMILES: C=CC(=O)OCC(CC)(COC(=O)C=C)COC(=O)C=C]

According to an embodiment of the present invention, the monomer of Formula 1 may be represented by Formula 10 below.

<Formula 10>

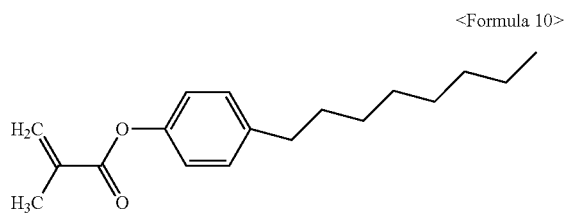 [SMILES: C=C(C)C(=O)Oc1ccc(CCCCCCCC)cc1]

According to an embodiment of the present invention, the monomer of Formula 2 may be represented by Formula 20 below.

<Formula 20>

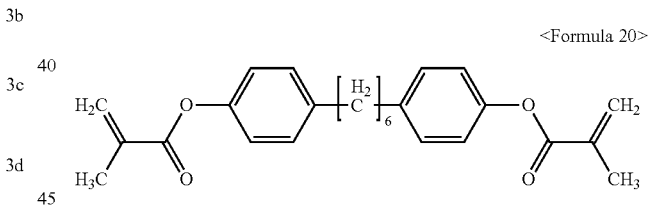

When the monomers are hardened to form the organic layer, an amount of a photo initiator in the organic layer may be in a range of about 0.5 to about 10 wt % based on the total amount of the monomers. However, the amount of the photo initiator is not limited thereto.

The photo initiator may be any one of various known photo initiators.

Hereinafter, definitions (or descriptions) of some suitable examples of substituents used herein are presented. The below-described substituents may be pendant or bridging substituents. It should be understood that the number of carbon atoms present in a substituent is not limited, and does not restrict the characteristics of the substituent, and although defined otherwise, substituents that are not particularly defined (or described) herein are understood according to their typical definition.

An unsubstituted C1 to C60 alkyl group may be linear or branched, and non-limiting examples thereof include methyl, ethyl, propyl, isobutyl, sec-butyl, pentyl, iso-amyl, hexyl, heptyl, octyl, nonanyl, dodecyl, and the like, and at least one hydrogen atom of the alkyl group may be substituted with a deuterium atom, a halogen atom, hydroxy group, a nitro group, a cyano group, an amino group, an amidino group, a hydrazine, a hydrazone, a carboxylic group or salt thereof, a sulfonic acid group or salt thereof, a phosphoric acid group or salt thereof, or a C1 to C10 alkyl group, a C1 to C10 alkoxy group, a C2 to C10 alkenyl group, a C2 to 010 alkynyl group, a C6 to C16 aryl group, or a C4 to C16 heteroaryl group.

The phrase "unsubstituted C2 to C60 alkenyl group: refers to an unsaturated alkyl group having at least one carbon-carbon double bond at the center or at a terminal of the alkyl group. Examples of the alkenyl group include an ethenyl group, a propenyl group, a butenyl group, and the like. At least one hydrogen atom in the unsubstituted alkenyl group may be substituted with a substituent as described above in conjunction with the alkyl group.

The phrase "unsubstituted C2 to C60 alkynyl group" refers to an alkyl group having at least one carbon-carbon triple bond at the center or at a terminal of the alkyl group. Non-limiting examples of the unsubstituted C2-C20 alkynyl group include acetylene, propylene, phenylacetylene, naphthylacetylene, isopropylacetylene, t-butylacetylene, and diphenylacetylene. At least one hydrogen atom in the alkynyl group may be substituted with a substituent as described above in conjunction with the alkyl group.

The phrase "unsubstituted C3-C60 cycloalkyl group" refers to a C3-C60 cyclic alkyl group wherein at least one hydrogen atom in the cycloalkyl group may be substituted with a substituent as described above in conduction with the C1-C60 alkyl group.

The phrase "unsubstituted C1-C60 alkoxy group" refers to a group having a structure of —OA wherein A is an unsubstituted C1-C60 alkyl group as described above. Non-limiting examples of the unsubstituted C1-C60 alkoxy group include methoxy, ethoxy, propoxy, isopropyloxy, butoxy, and pentoxy. At least one hydrogen atom of the alkoxy group may be substituted with a substituent such as those described above in conjunction with the alkyl group.

The phrase "unsubstituted C5-C60 aryl group" refers to a carbocyclic aromatic system containing at least one ring. At least two rings may be fused to each other or linked to each other by a single bond. The term 'aryl' refers to an aromatic system, such as phenyl, naphthyl, or anthracenyl. At least one hydrogen atom in the aryl group may be substituted with a substituent as described above in conjunction with the unsubstituted C1-C60 alkyl group.

Non-limiting examples of the substituted or unsubstituted C5-C60 aryl group include a phenyl group, a C1 to C10 alkylphenyl group (for example, ethylphenyl group), a biphenyl group, a C1 to C10 alkylbiphenyl group, a C1 to C10 alkoxybiphenyl group, an o-, m-, or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, pentalenyl group, an indenyl group, a naphthyl group, a C1 to C10 alkylnaphthyl group (for example, methylnaphthyl group), a C1 to C10 alkoxynaphthyl group (for example, methoxynaphthyl group), an anthracenyl group, an azrenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, perylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group.

The phrase "unsubstituted C3-C60 heteroaryl group" refers to a group including one, two or three hetero atoms selected from N, O, P and S. At least two rings may be fused to each other or linked to each other by a single bond. Non-limiting examples of the unsubstituted C4-C60 heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indol group, a quinolyl group, an isoquinolyl group, and a dibenzothiophene group. In addition, at least one hydrogen atom in the heteroaryl group may be substituted with a substituent as described above in conjunction with the unsubstituted C1-C60 alkyl group.

The phrase "unsubstituted C5-C60 aryloxy group" refers to a group represented by —$OA_1$ wherein $A_1$ may be a C5-C60 aryl group. An example of the aryloxy group is a phenoxy group. At least one hydrogen atom in the aryloxy group may be substituted with a substituent as described above in conjunction with the unsubstituted C1-C60 alkyl group.

The phrase "unsubstituted C5-C60 arylthio group" refers to a group represented by —$SA_1$ wherein $A_1$ may be a C5-C60 aryl group. Non-limiting examples of the arylthio group include a benzenethio group and a naphthylthio group. At least one hydrogen atom in the arylthio group may be substituted with a substituent as described above in conjunction with the unsubstituted C1-C60 alkyl group.

The phrase "unsubstituted C6-C60 condensed polycyclic group" refers to a substituent including at least two rings wherein at least one aromatic ring and/or at least one non-aromatic ring are fused to each other, or refers to a substituent having an unsaturated group in a ring that may not form a conjugate structure. The unsubstituted C6-C60 condensed polycyclic group is distinctive from an aryl group or a heteroaryl group in terms of being non-aromatic.

The inorganic layer according to an embodiment of the present invention may be a metal oxide or an inorganic film.

In detail, the inorganic layer may be $Al_2O_3$, AlO, AlON, MgO, CaO, ZnO, $TiO_2$, WOx, SiNx, SiOx, or SiON. For example, the inorganic layer may be $Al_2O_3$.

The display unit of the organic light-emitting device according to an embodiment of the present invention may include an emission layer, an electron injection layer, an electron transport layer, a functional layer including electron injection and electron transport abilities, a hole injection layer, a hole transport layer, or a functional layer having hole injection and hole transport abilities, and any one layer of a red layer, a green layer, a blue layer, and a white layer of the emission layer may include a phosphorescent compound.

The hole injection layer, the hole transport layer, or the functional layer having hole injection and hole transport abilities may further include a charge generating material. Also, the charge generating material may be a p-dopant, and the p-dopant may be a quinone derivative, a metal oxide, or a cyano group-containing compound.

According to an embodiment of the present invention, the display unit includes an electron transport layer, and the electron transport layer may include an electron transporting organic compound and a metal complex. The metal complex may be a Li complex.

The accompanying drawing is a schematic sectional view of an organic light-emitting device according to an embodiment of the present invention. Hereinafter, the structure of an organic light-emitting device and a method of manufacturing an organic light-emitting device are described in detail with reference to the accompanying drawing. First, two electrodes and organic layers interposed therebetween of the display unit are described.

A substrate, which may be any substrate that is used in general OLEDs, may be a glass substrate or a transparent plastic substrate, having excellent mechanical strength, thermal stability, transparency, surface smoothness, ease of handling, and water resistance.

A first electrode may be formed by depositing or sputtering a material for a first electrode on the substrate. When the first electrode is an anode, a material having a high work function may be used as the first electrode-forming material to facilitate hole injection. The first electrode may be a reflective electrode or a transmission electrode (e.g., a transmissive electrode). Transparent and conductive materials, such as ITO, IZO, SnO2, and ZnO, may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single-layer structure or a multi-layer structure including at least two layers. For example, the first electrode may have a three-layered structure of ITO/Ag/ITO, but it is not limited thereto.

An organic layer may be on the first electrode.

The organic layer may include a hole injection layer (HIL), a hole transport layer (HTL), a buffer layer, an emission layer (EML), an electron transport layer (ETL), or an electron injection layer (EIL).

The HIL may be formed on the first electrode by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature in a range of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, the desired structure and the thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

The HIL may be formed of any material that is commonly used to form a HIL. Non-limiting examples of the material that can be used to form the HIL include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA; shown below), N,N'-di(1-naphthyl)-N,N'-diphenylbenzidine (NPB), TDATA (shown below), 2T-NATA (shown below), polyaniline/dodecylbenzenesulfonic acid (Pani/DBSA), poly (3,4-ethylenedioxythiophene)/poly(4-styrenesulfonate) (PEDOT/PSS), polyaniline/camphor sulfonic acid (Pani/CSA), and polyaniline/poly(4-styrenesulfonate) (PANI/PSS).

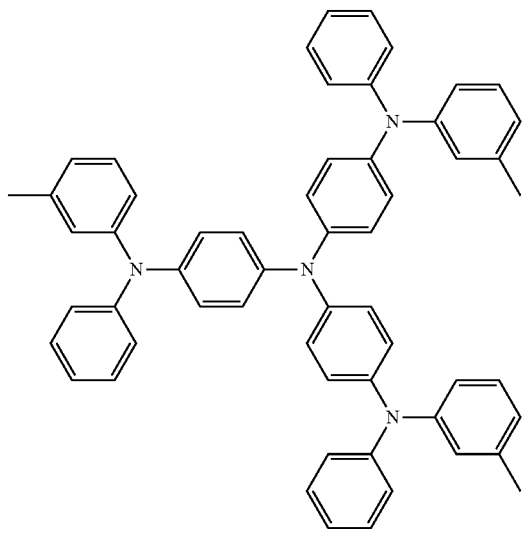

m-MTDATA

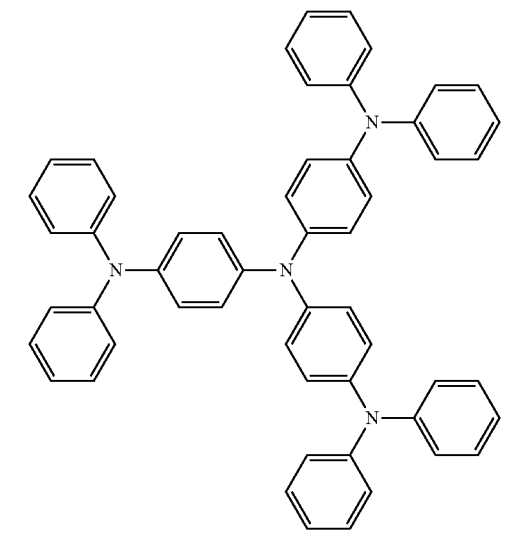

TDATA

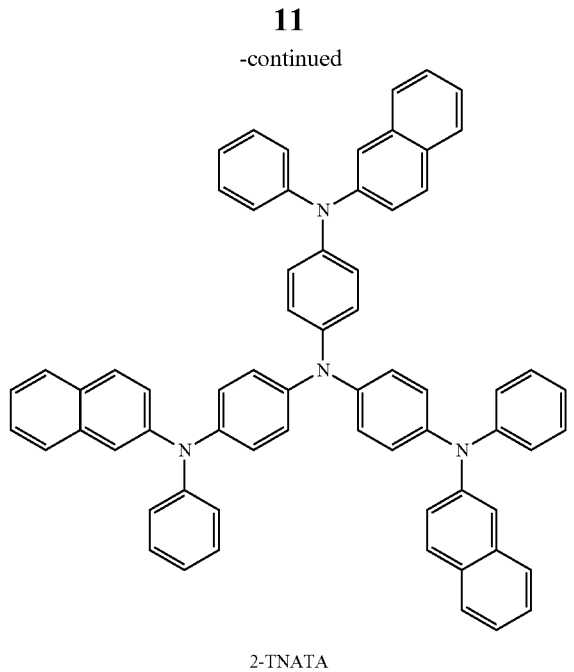

2-TNATA

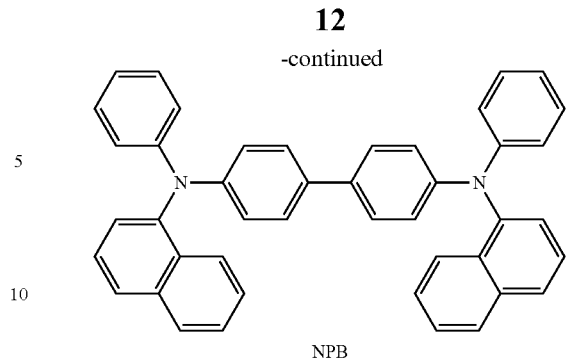

NPB

The thickness of the HIL may be in a range of about 100 Å to about 10000 Å, and in some embodiments, may be in a range of about 100 Å to about 1000 Å. When the thickness of the HIL is within the foregoing ranges, the HIL may have good hole injecting ability without a corresponding substantial increase in driving voltage as compared to an HIL having a thickness that is not within the foregoing ranges.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

As a hole transporting material, any known hole transporting materials may be used. Non-limiting examples of suitable known hole transporting materials include carbazole derivatives, such as N-phenylcarbazole or polyvinylcarbazole, N,N'-bis(3-methylphenyl)-N,N'-diphenyl-[1,1-biphenyl]-4,4'-diamine (TPD; shown below), 4,4',4''-tris(N-carbazolyl) triphenylamine (TCTA), and N,N'-di(1-naphthyl)-N,N'-diphenylbenzidine) (NPB; shown below).

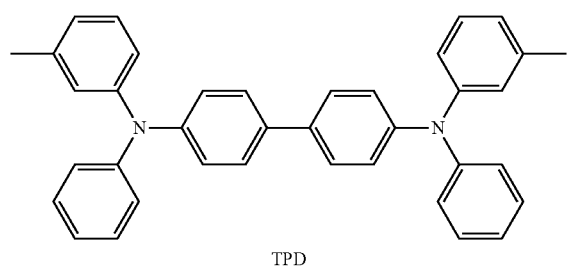

TPD

The thickness of the HTL may be in a range of about 50 Å to about 2000 Å, and in some embodiments, in a range of about 100 Å to about 1500 Å. When the thickness of the HTL is within the foregoing ranges, the HTL may have good hole transporting ability without a corresponding substantial increase in driving voltage as compared to an HTL having a thickness that is not within the foregoing ranges.

The functional layer having both hole injection and hole transport abilities (hereinafter referred to as an H-functional layer) may contain at least one material from each group of the hole injection layer materials and hole transport layer materials. The thickness of the H-functional layer may be in a range of about 500 Å to about 10,000 Å, and in some embodiments, may be in a range of about 100 Å to about 1,000 Å. When the thickness of the H-functional layer is within the foregoing ranges, the H-functional layer may have good hole injection and transport abilities without a corresponding substantial increase in driving voltage as compared to an H-functional layer having a thickness that is not within the foregoing ranges.

In some embodiments, at least one of the HIL, HTL, and H-functional layer may include at least one of a compound of Formula 300 below and a compound of Formula 350 below:

<Formula 300>

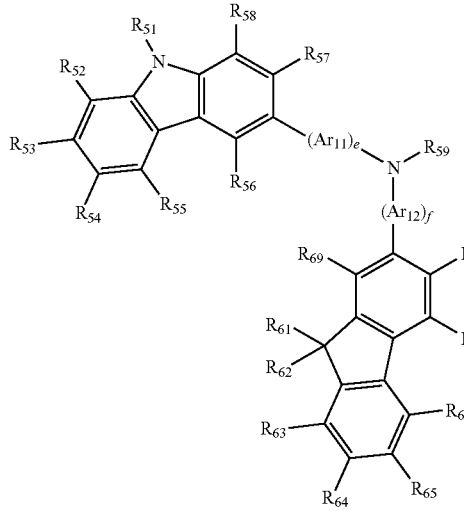

<Formula 350>

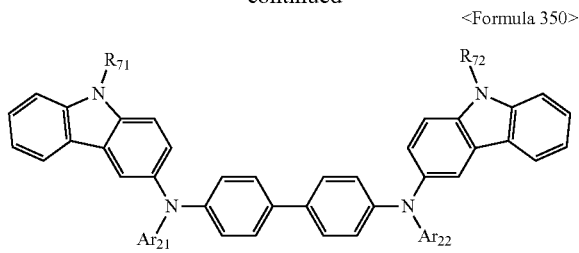

Ar₁₁, Ar₁₂, Ar₂₁, and Ar₂₂ in Formulae 300 and 350 may each independently be a substituted or unsubstituted $C_5$-$C_{60}$ aryl or arylene group.

In Formula 300, e and f may each independently be an integer from 0 to 5, for example, 0, 1, or 2. In a non-limiting embodiment, e may be 1, and f may be 0.

$R_{51}$ to $R_{58}$, $R_{61}$ to $R_{69}$, and $R_{71}$ and $R_{72}$ in Formulae 300 and 350 above may each independently be a hydrogen atom, a deuterium atom, a halogen atom, a hydroxyl group, a cyano group, a nitro group, an amino group, an amidino group, a hydrazine, a hydrazone, a carboxyl group or salt thereof, a sulfonic acid group or salt thereof, a phosphoric acid group or salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{51}$ to $R_{58}$, $R_{61}$ to $R_{69}$ and $R_{71}$ and $R_{72}$ may each independently be a hydrogen atom; a deuterium atom; a halogen atom; a hydroxyl group; a cyano group; a nitro group; an amino group; an amidino group; a hydrazine; hydrazone; a carboxyl group or salt thereof; a sulfonic acid group or salt thereof; a phosphoric acid group or salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group, substituted with at least one of a deuterium atom, a halogen atom, a hydroxyl group, a cyano group, a nitro group, an amino group, an amidino group, a hydrazine, a hydrazone, carboxyl group or salt thereof, a sulfonic acid group or salt thereof, and a phosphoric acid group or salt thereof; a phenyl group; a naphthyl group; an anthryl group; a fluorenyl group; a pyrenyl group; or a phenyl group, a naphthyl group, an anthryl group, a fluorenyl group, and a pyrenyl group substituted with at least one of a deuterium atom, a halogen atom, a hydroxyl group, a cyano group, a nitro group, an amino group, an amidino group, a hydrazine, a hydrazone, a carboxyl group or salt thereof, a sulfonic acid group or salt thereof, a phosphoric acid group or salt thereof, a $C_1$-$C_{10}$ alkyl group and a $C_1$-$C_{10}$ alkoxy group, but they are not limited thereto.

$R_{59}$ in Formula 300 may be one of a phenyl group; a naphthyl group; an anthryl group; a biphenyl group; a pyridyl group; and a phenyl group, a naphthyl group, an anthryl group, a biphenyl group, and a pyridyl group substituted with at least one of a deuterium atom, a halogen atom, hydroxyl group, cyano group, nitro group, amino group, amidino group, hydrazine, hydrazone, carboxyl group or salt thereof, sulfonic acid group or salt thereof, phosphoric acid group or salt thereof, substituted or unsubstituted $C_1$-$C_{20}$ alkyl group, and substituted or unsubstituted $C_1$-$C_{20}$ alkoxy group.

According to an embodiment of the present invention, the compound represented by Formula 300 may be represented by Formula 300A, but the compound represented by Formula 300 is not limited thereto:

<Formula 300A>

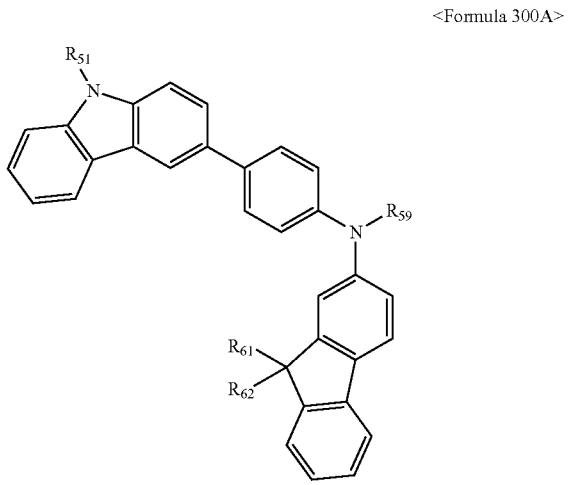

Detailed descriptions of $R_{51}$, $R_{61}$, $R_{52}$ and $R_{59}$ in Formula 300A are the same as defined above.

At least one of the HIL, HTL, and H-functional layer may include at least one of the compounds represented by Formulae 301 to 320 below:

301

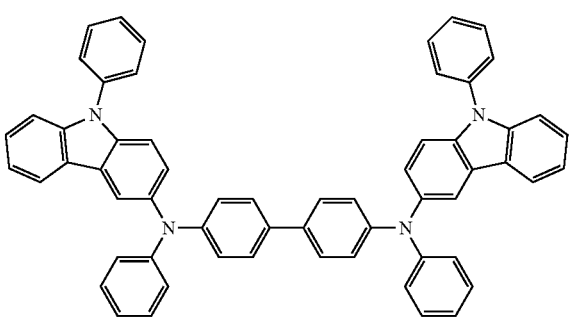

302

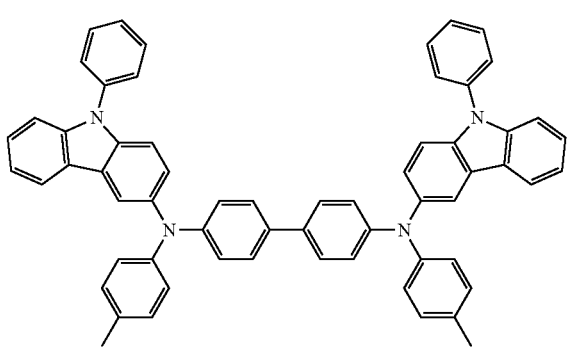

303
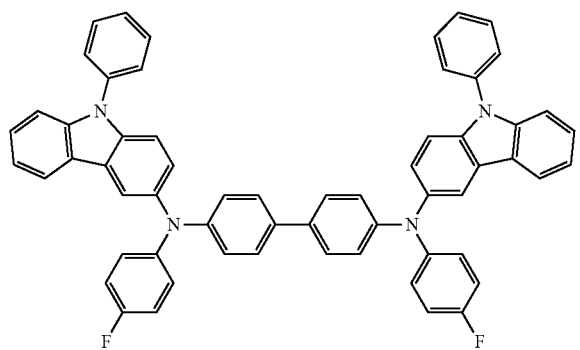
304
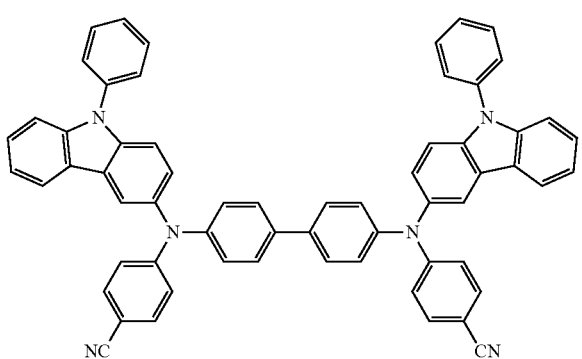
305
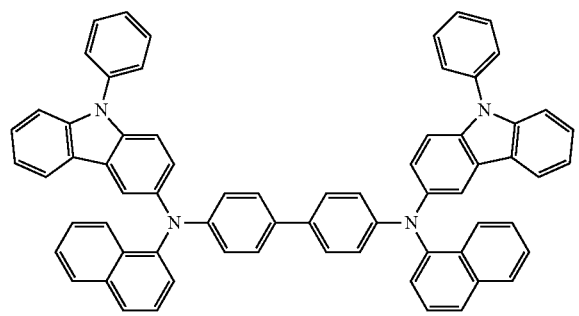
306
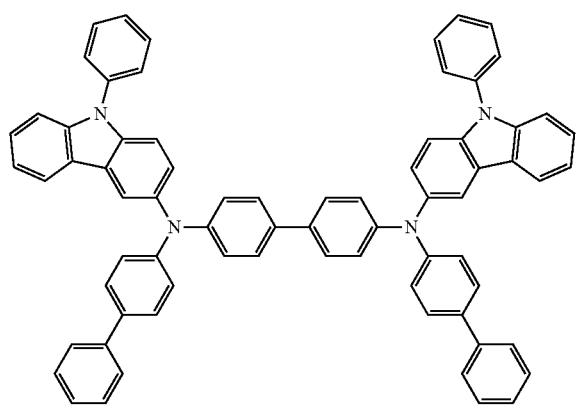
307
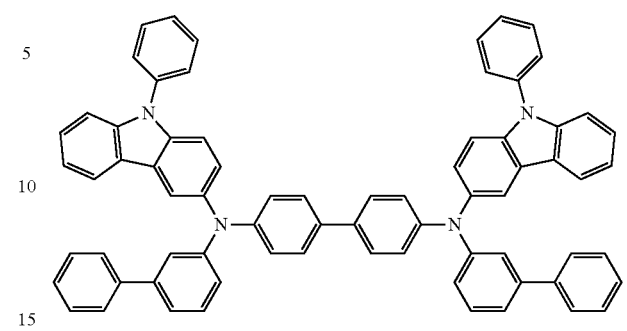
308
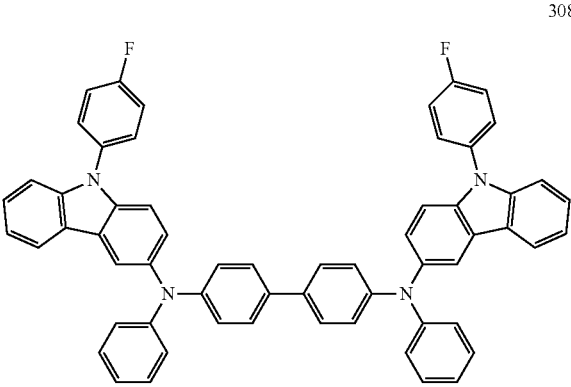
309
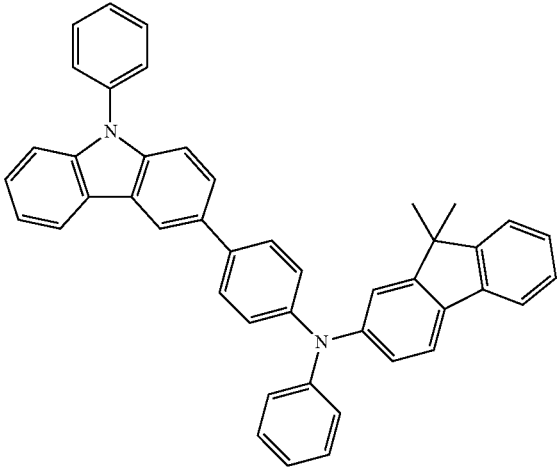

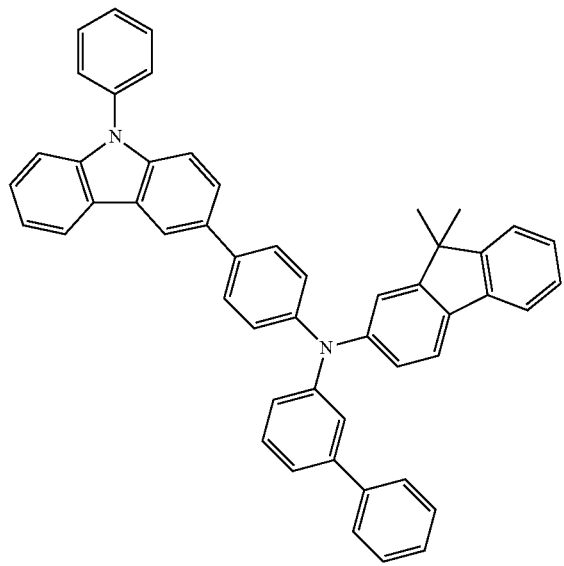
310
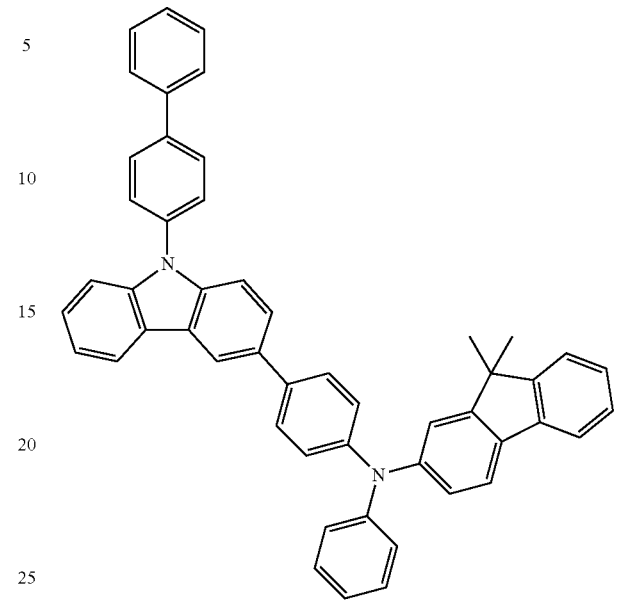
312
311
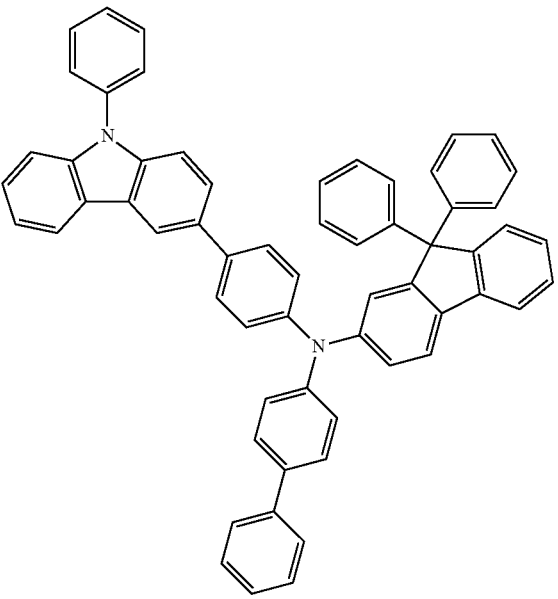
313

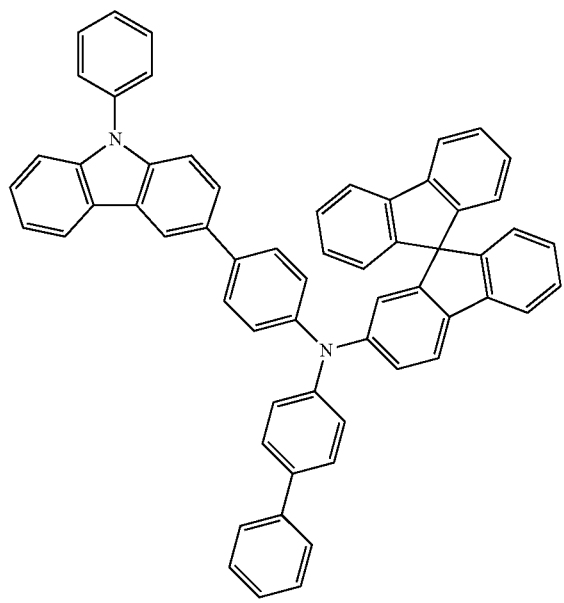
314
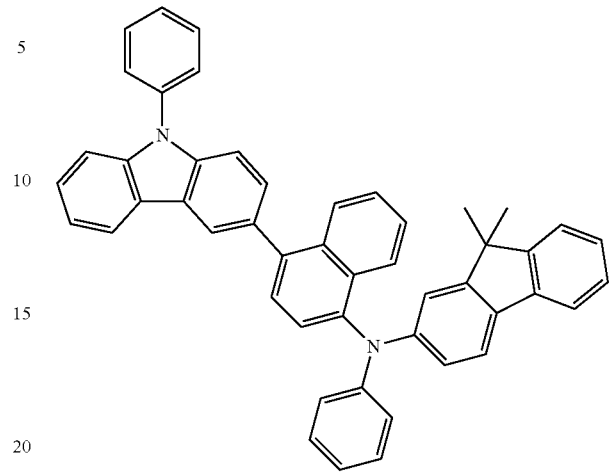
316
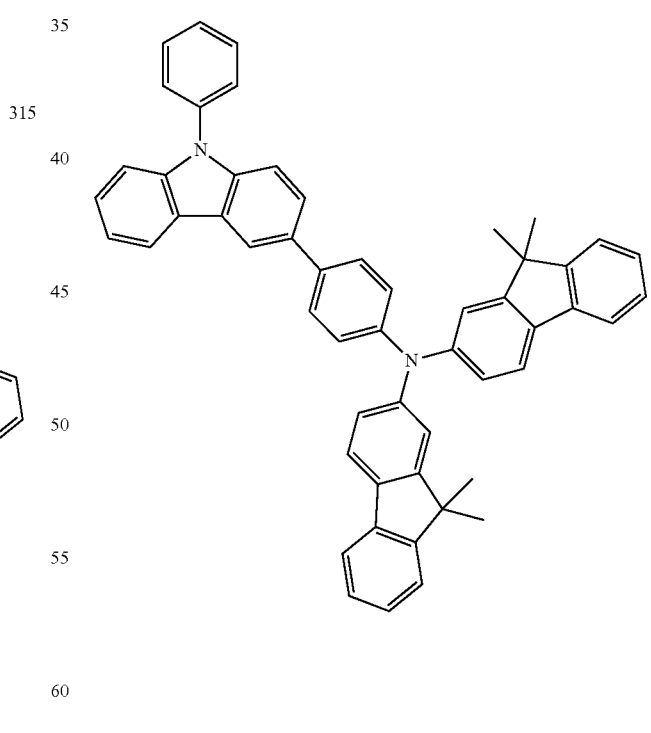
315
317

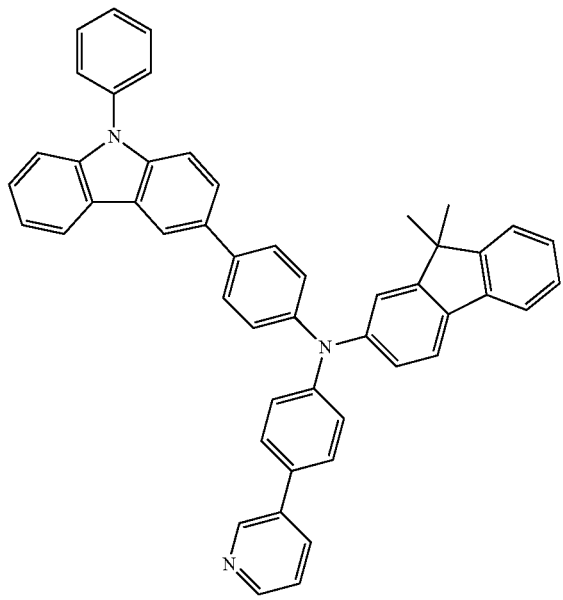

318

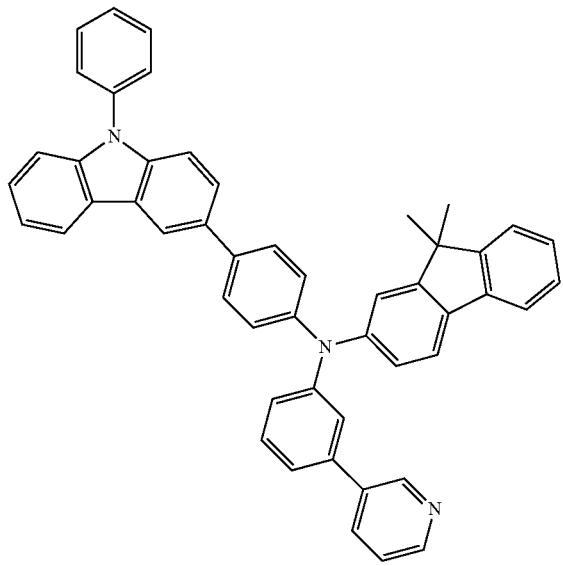

319

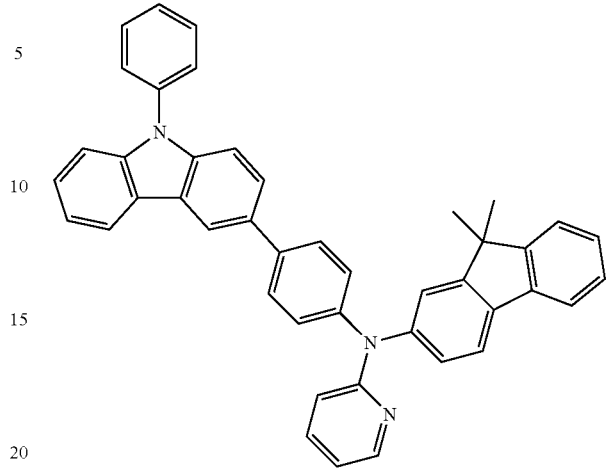

320

At least one of the HIL, HTL, and H-functional layer may further include a charge-generating material for improved layer conductivity, in addition to a known hole injecting material, hole transport material, and/or material having both hole injection and hole transport capabilities as described above.

The charge-generating material may be, for example, a p-dopant. The p-dopant may be one of quinone derivatives, metal oxides, and compounds with a cyano group, but it is not limited thereto. Non-limiting examples of the p-dopant include quinone derivatives such as tetracyanoquinonedimethane (TCNQ), 2,3,5,6-tetrafluoro-tetracyano-1,4-benzoquinonedimethane (F4-CTNQ; shown below), and the like; metal oxides such as tungsten oxide, molybdenum oxide, and the like; and cyano-containing compounds such as Compound 200 below.

<Compound 200>

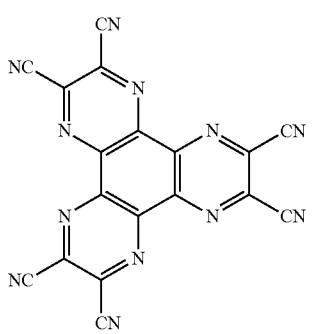

<F4-CTNQ>

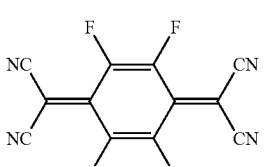

When the HIL, HTL, or H-functional layer further includes a charge-generating material, the charge-generating material may be homogeneously dispersed or inhomogeneously distributed in the layer.

A buffer layer may be between at least one of the HIL, HTL, and H-functional layer, and the EML. The buffer layer may compensate for an optical resonance distance of light according to a wavelength of the light emitted from the EML, and thus may increase efficiency. The buffer layer may include any hole injecting material or hole transporting material that are known. In some other embodiments, the buffer layer may include the same material as one of the materials included in the HIL, HTL, and/or H-functional layer that may underlie the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary according to the material that is used to form the EML.

The EML may be formed using any known light-emitting material, such as known hosts and dopants. Any known fluorescent dopant or phosphorescent dopant may be used as the dopant.

Non-limiting examples of the host include $Alq_3$, 4,4'-N,N'-dicarbazole-biphenyl (CBP; shown below), poly(n-vinylcarbazole) (PVK; shown below), 9,10-di(naphthalene-2-yl)anthracene (ADN; shown below), TCTA, 1,3,5-tris(N-phenylbenzimidazole-2-yl)benzene (TPBI; shown below), 3-tert-butyl-9,10-di-2-naphthylanthracene (TBADN; shown below), E3 (shown below), distyrylarylene (DSA), dmCBP (shown below), and Compounds 501 to 509 below.

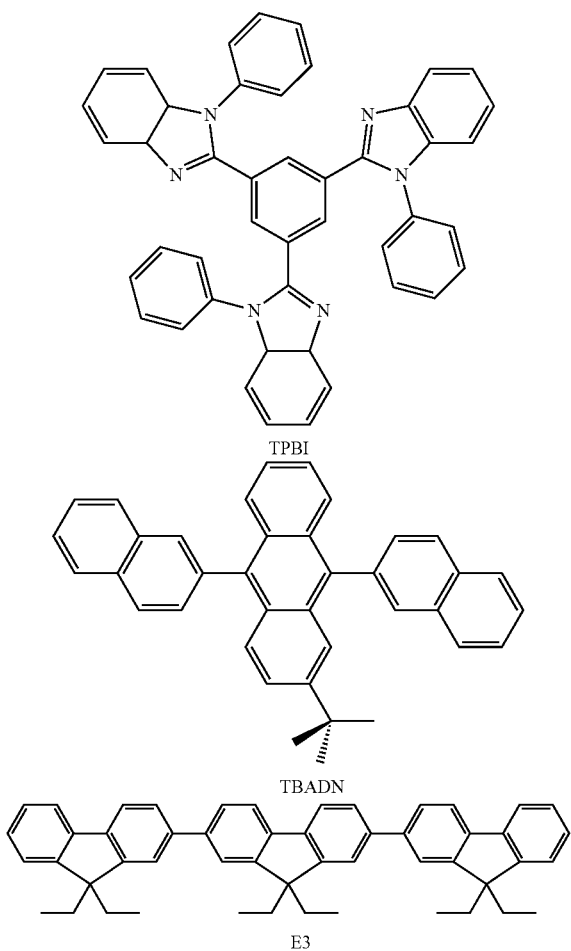

TPBI

TBADN

E3

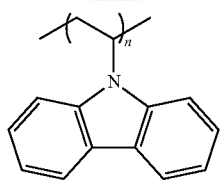

PVK

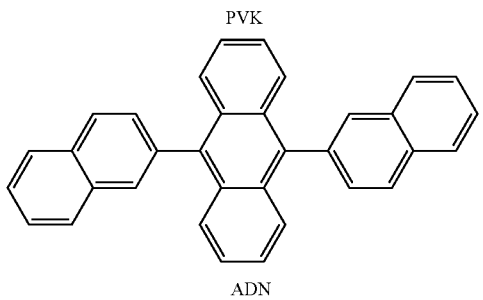

ADN

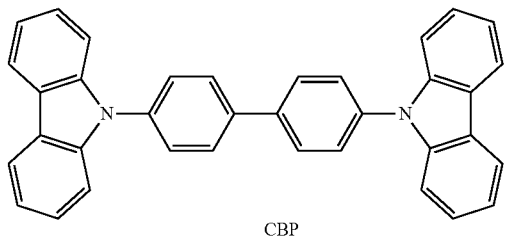

CBP

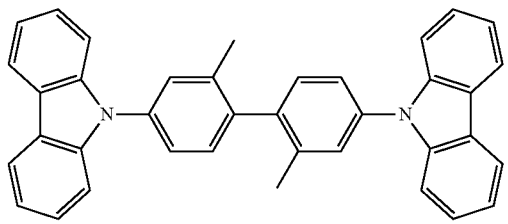

dmCBP

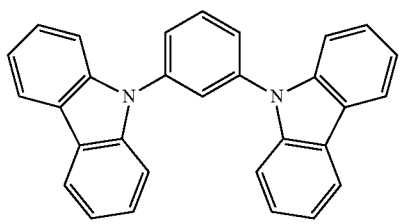

501

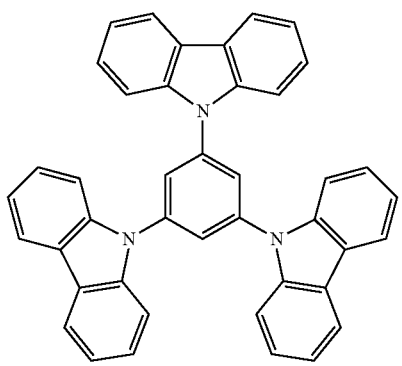

502

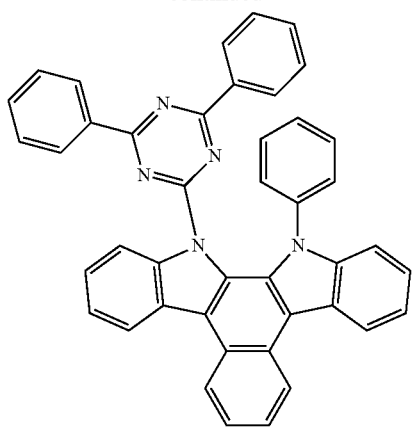
503
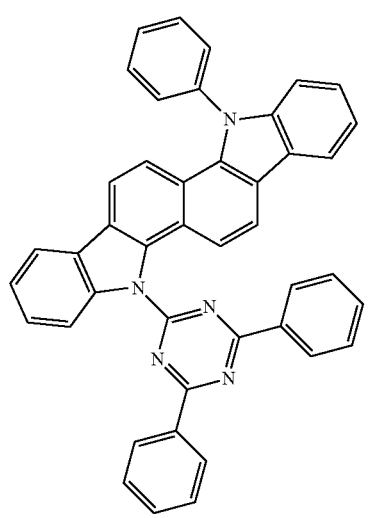
504
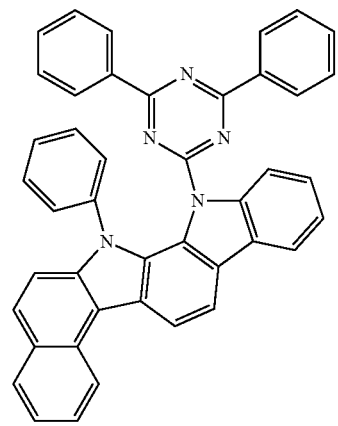
505
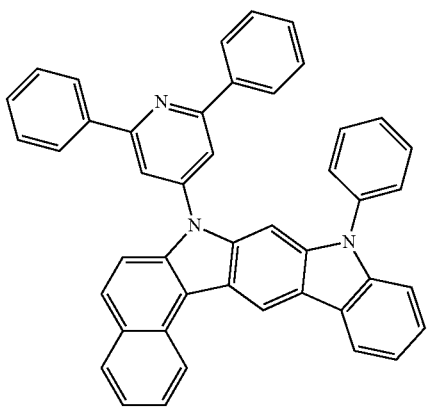
506
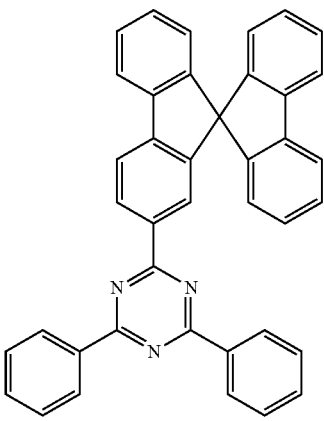
507
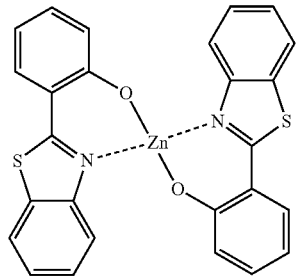
508
509
In some embodiments, an anthracene-based compound represented by Formula 400 below may be used as the host.

<Formula 400>

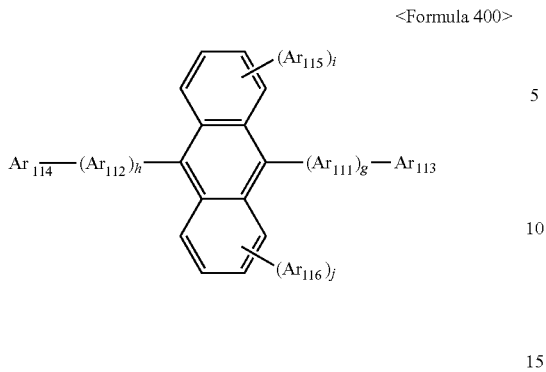

In Formula 400, $Ar_{111}$ and $Ar_{112}$ may each independently be a substituted or unsubstituted $C_5$-$C_{60}$ arylene group; $Ar_{113}$ to $Ar_{116}$ may each independently be a substituted or unsubstituted $C_1$-$C_{10}$ alkyl group, or a substituted or unsubstituted $C_5$-$C_{60}$ aryl group; and g, h, i, and j may each independently be an integer from 0 to 4.

In some non-limiting embodiments, $Ar_{111}$ and $Ar_{112}$ in Formula 400 may each independently be a phenylene group, a naphthylene group, a phenanthrenylene group, or a pyrenylene group; or a phenylene group, a naphthylene group, a phenanthrenylene group, a fluorenylene group, or a pyrenylene group that are substituted with at least one of a phenyl group, a naphthyl group, and an anthryl group.

In Formula 400 above, g, h, i, and j may each independently be 0, 1, or 2.

In Formula 400, $Ar_{113}$ to $Ar_{116}$ may each independently be one of a $C_1$-$C_{10}$ alkyl group that is substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

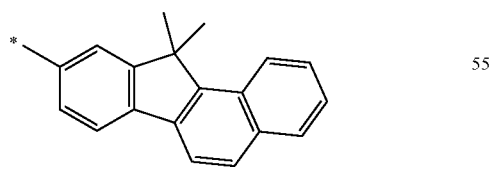

but they are not limited thereto.

For example, the anthracene-based compound of Formula 400 above may be one of the compounds represented by the following formulae, but is not limited thereto:

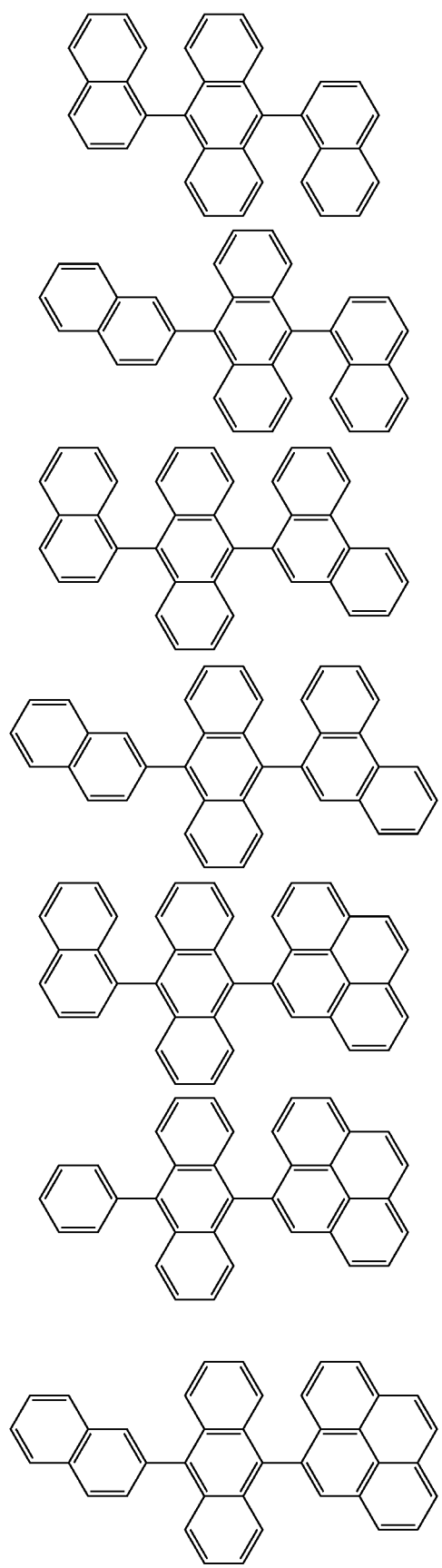

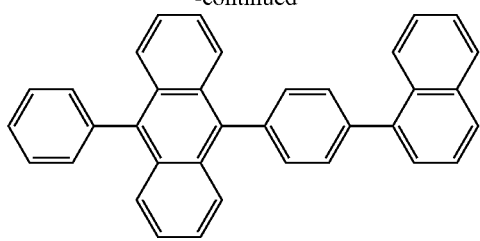
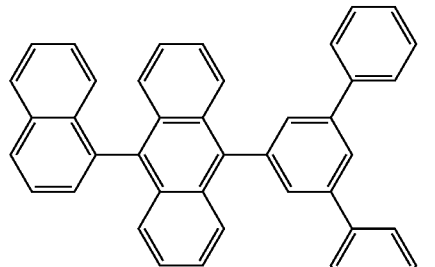
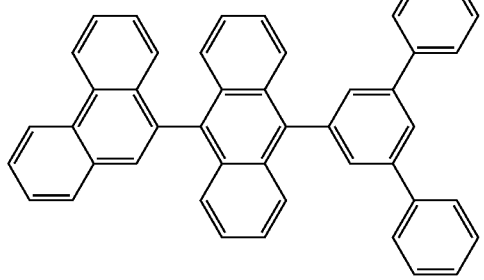
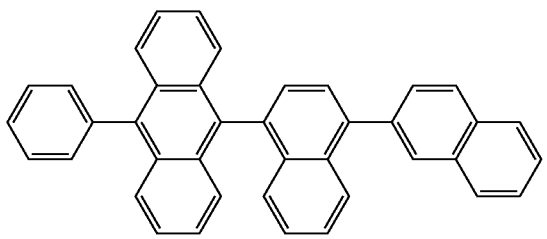
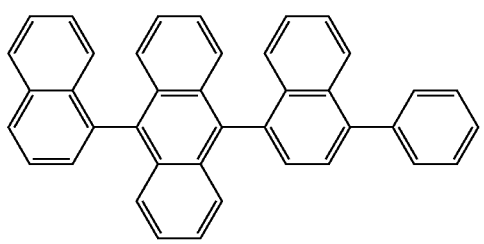
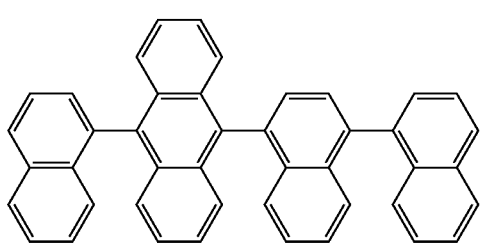
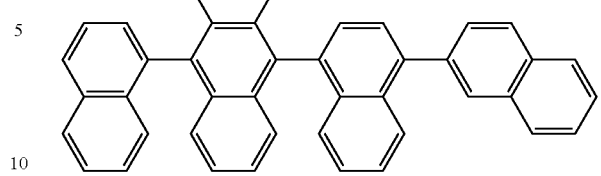
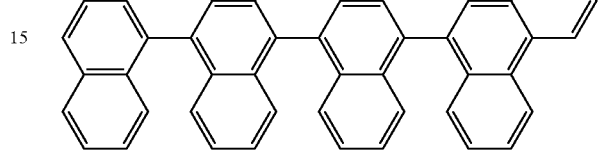
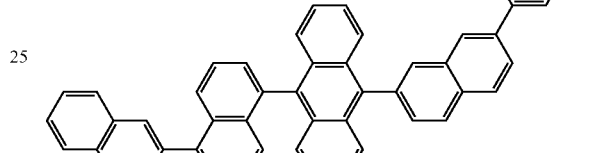
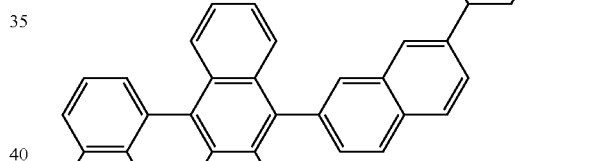
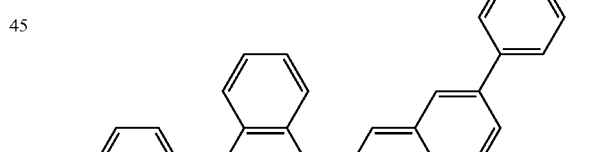
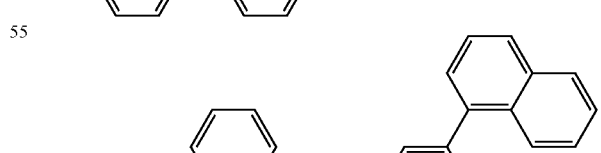
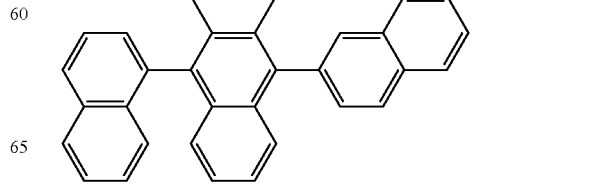

-continued
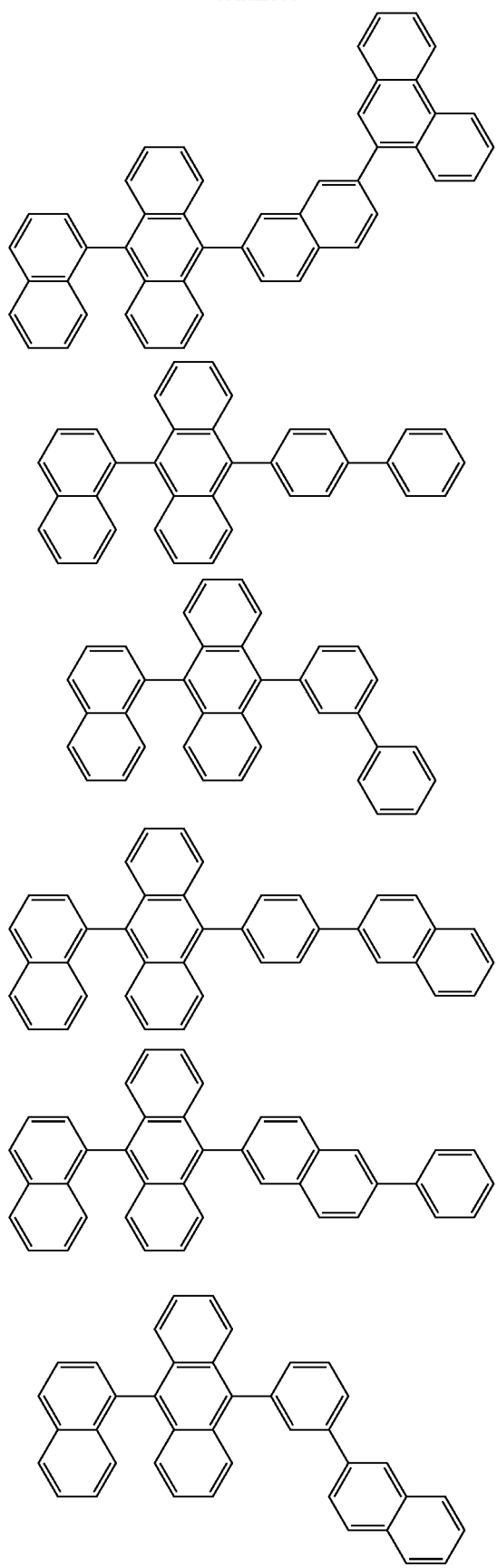
-continued
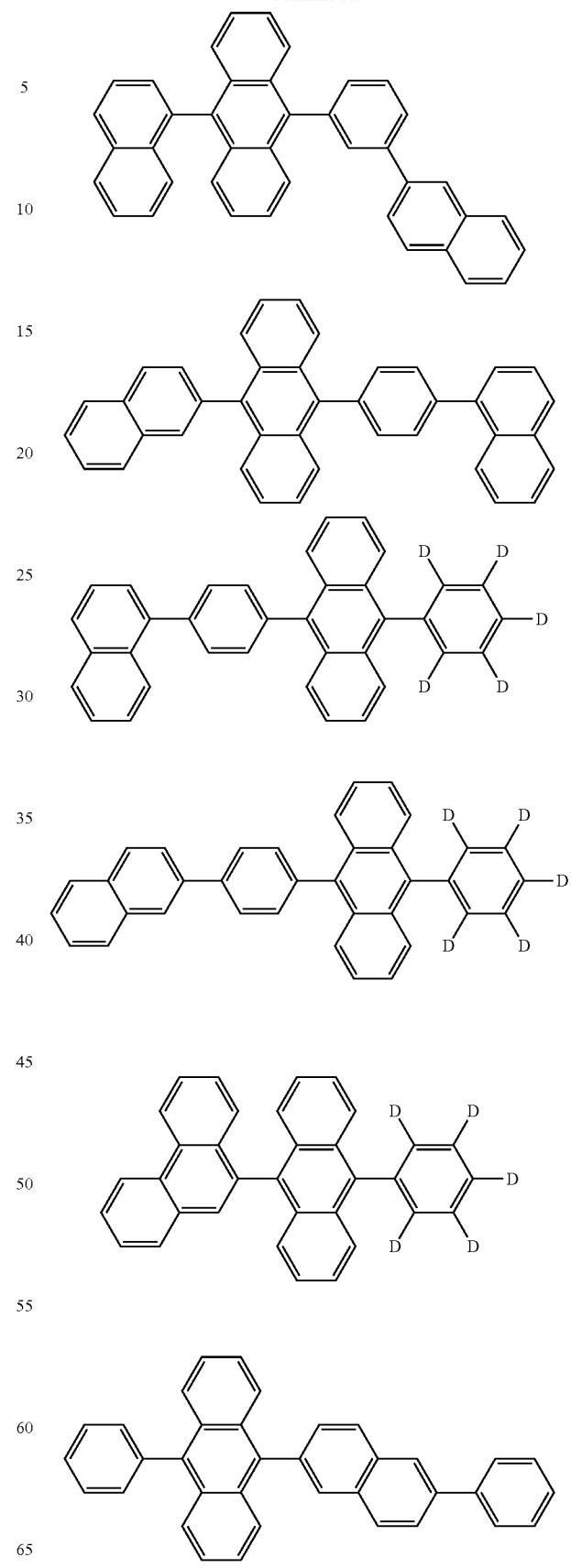

33
-continued
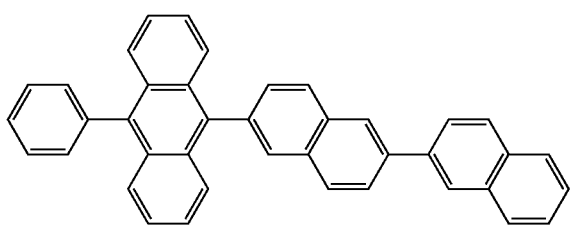
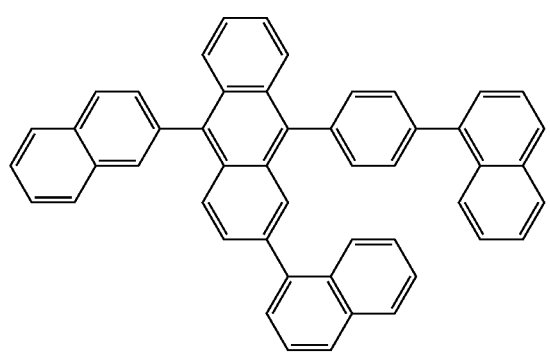
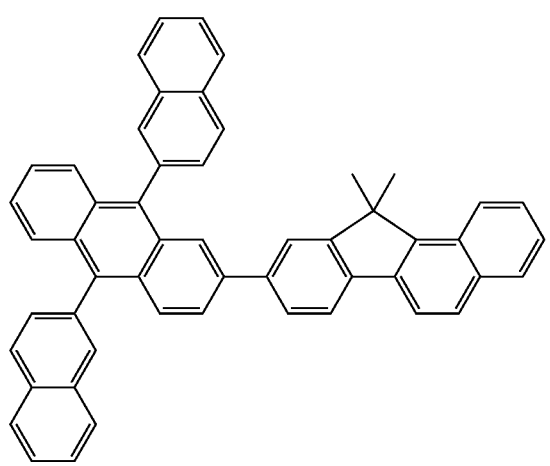
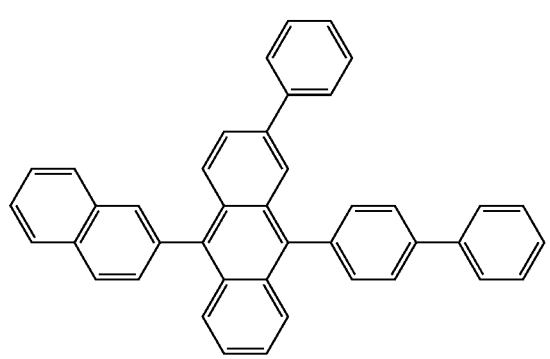
34
-continued
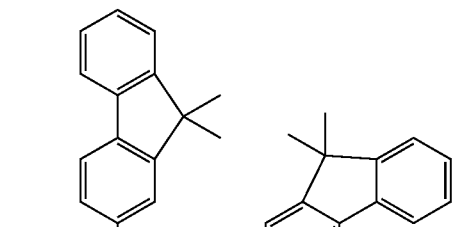
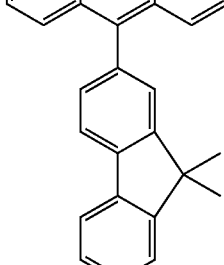
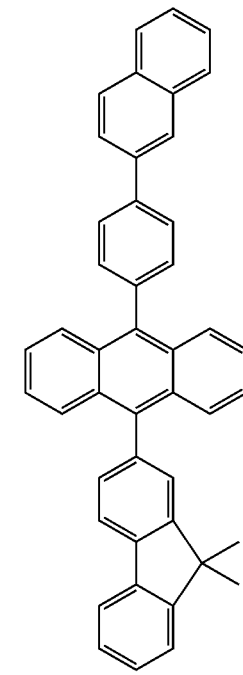
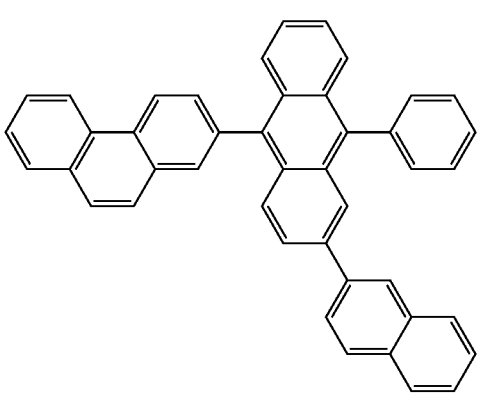 [SMILES: c1ccc(-c2c3ccccc3c(-c3ccc4c(ccc5ccccc54)c3)c3ccc(-c4ccc5ccccc5c4)cc23)cc1]

In some embodiments, an anthracene-based compound represented by Formula 401 below may be used as the host.

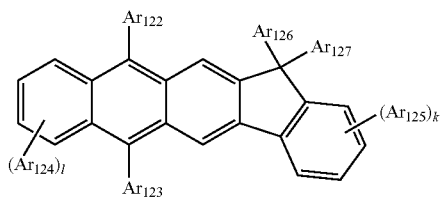

<Formula 401>

$Ar_{122}$ to $Ar_{125}$ in Formula 401 above may be defined as described above in conjunction with $Ar_{113}$ of Formula 400, and thus detailed descriptions thereof will not be provided here.

$Ar_{126}$ and $Ar_{127}$ in Formula 401 above may each independently be a $C_1$-$C_{10}$ alkyl group, for example, a methyl group, an ethyl group, or a propyl group.

In Formula 401, k and l may each independently be an integer from 0 to 4, for example, 0, 1, or 2.

For example, the anthracene-based compound of Formula 401 above may be one of the compounds represented by the following formulae, but is not limited thereto:

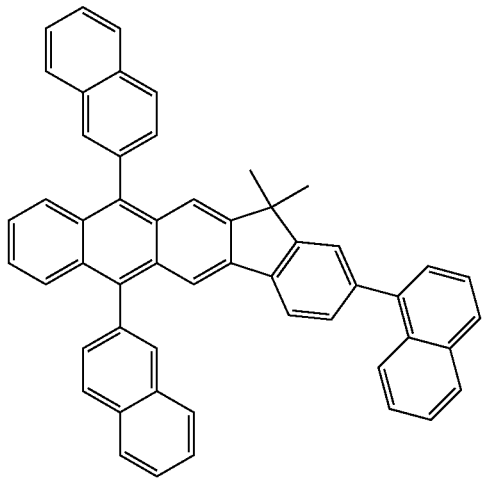

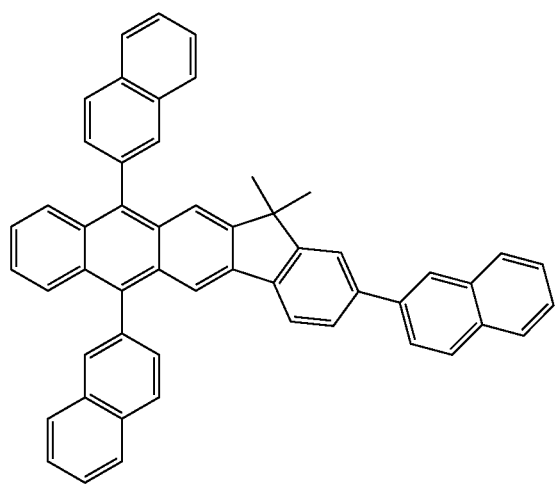

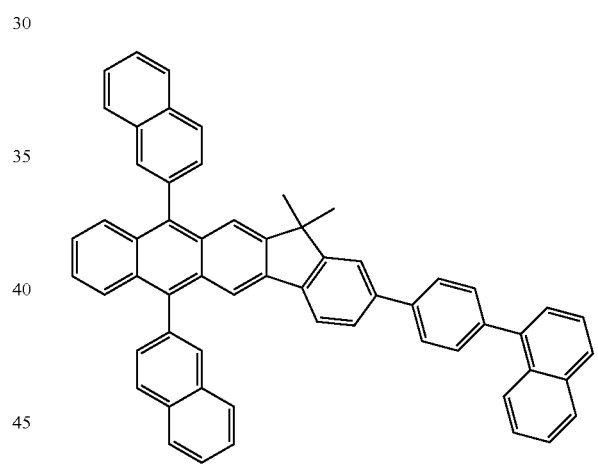

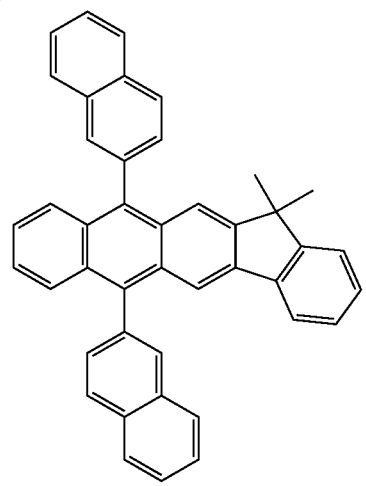

When the organic light-emitting device is a full color organic light-emitting device, the emission layer may be patterned into (or formed to be) a red emission layer, a green emission layer, and a blue emission layer.

At least one of the red EML, the green EML, and the blue EML may include a dopant below (ppy=phenylpyridine).

Non-limiting examples of the blue dopant include compounds represented by the following formulae.

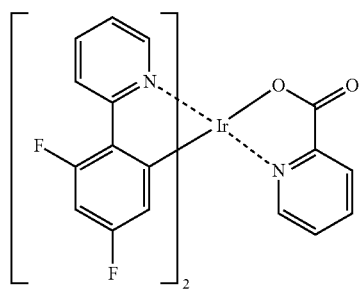
F2Irpic
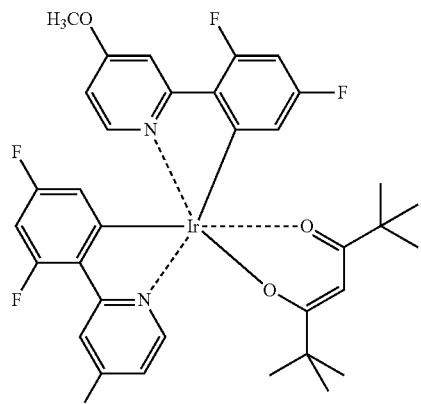
(F2ppy)2Ir(tmd)
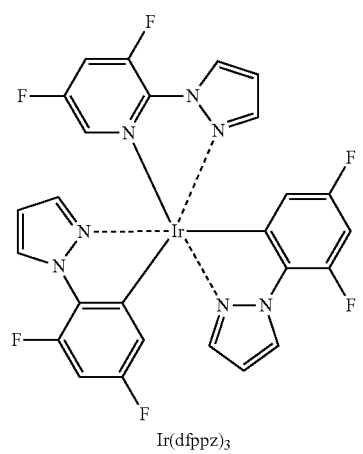
Ir(dfppz)3
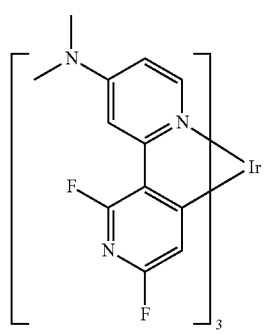
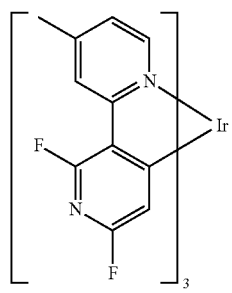
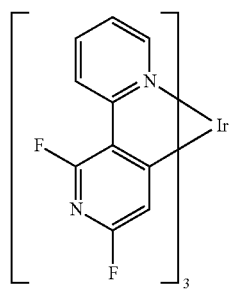
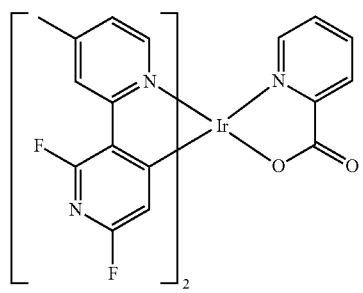
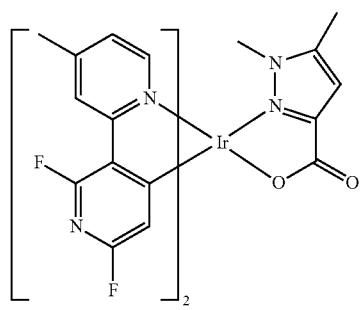

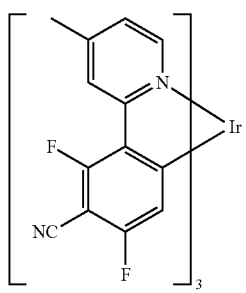
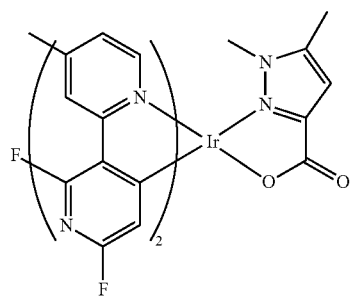
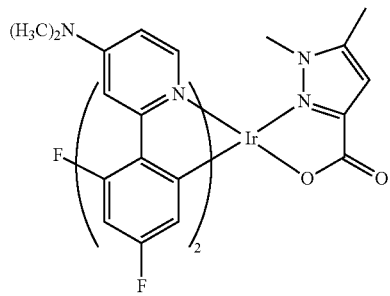
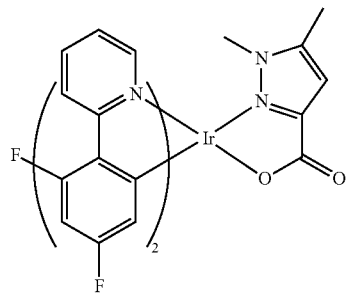
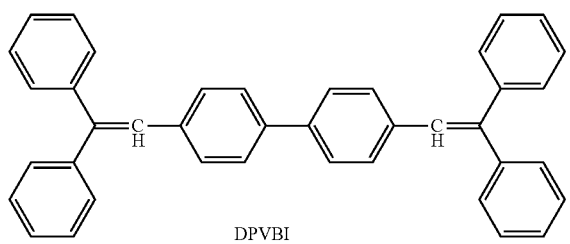
DPVBI
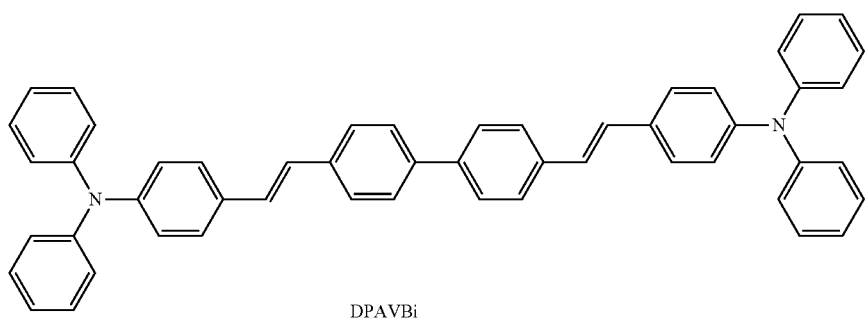
DPAVBi
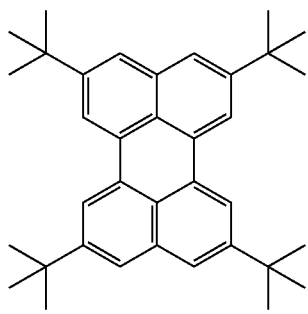
TBPe Non-limiting examples of the red dopant include compounds represented by the following formulae.
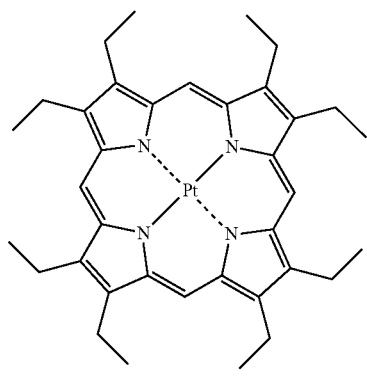
PtOEP
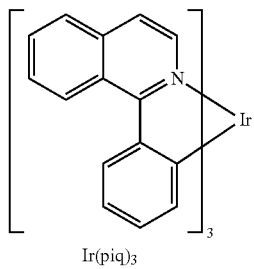
Ir(piq)₃
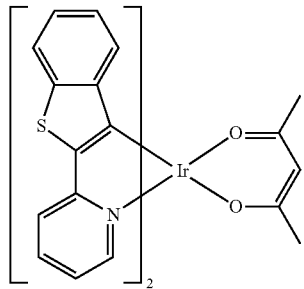
Btp₂Ir(acac)
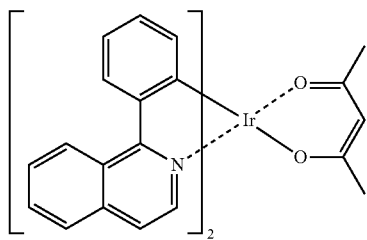
Ir(pq)₂(acac)
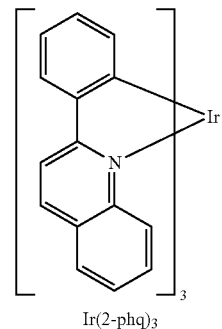
Ir(2-phq)₃
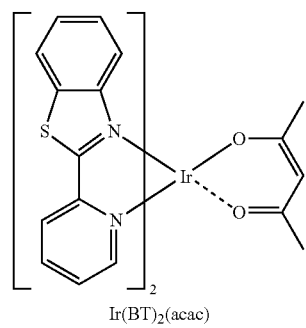
Ir(BT)₂(acac)
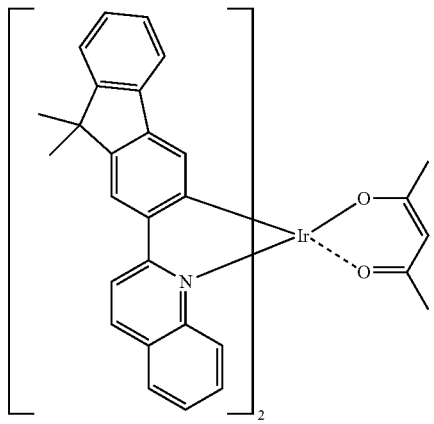
Ir(flq)₂(acac)
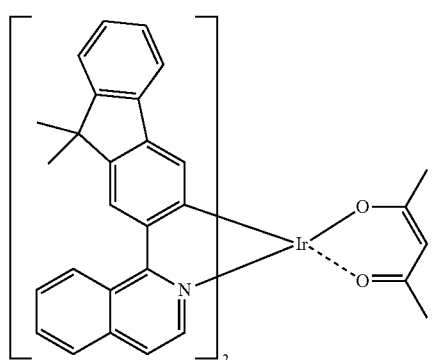
Ir(fliq)₂(acac)

-continued
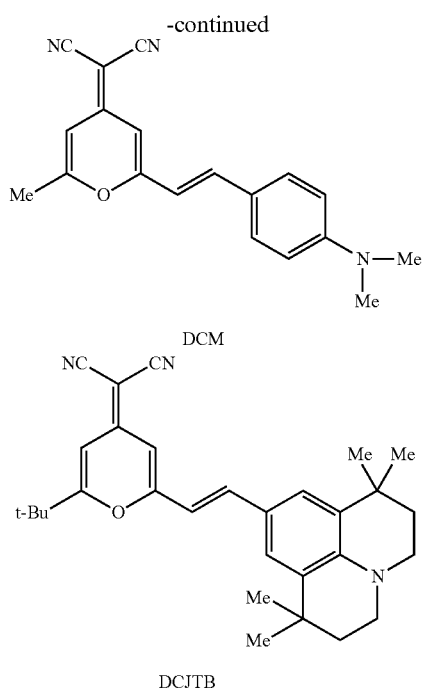
DCM
DCJTB
Non-limiting examples of the green dopant include compounds represented by the following formulae.
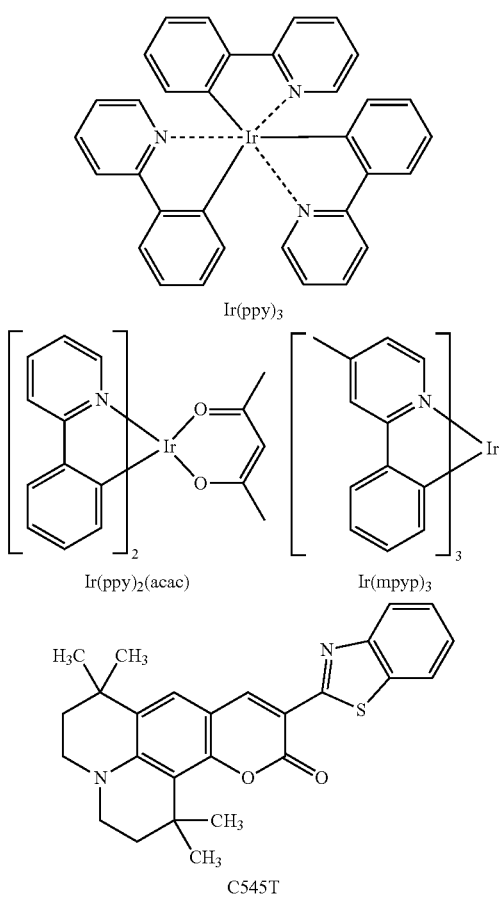
Ir(ppy)₃
Ir(ppy)₂(acac)    Ir(mpyp)₃
C545T
Non-limiting examples of the dopant that may be used in the EML include Pt complexes represented by the following formulae.
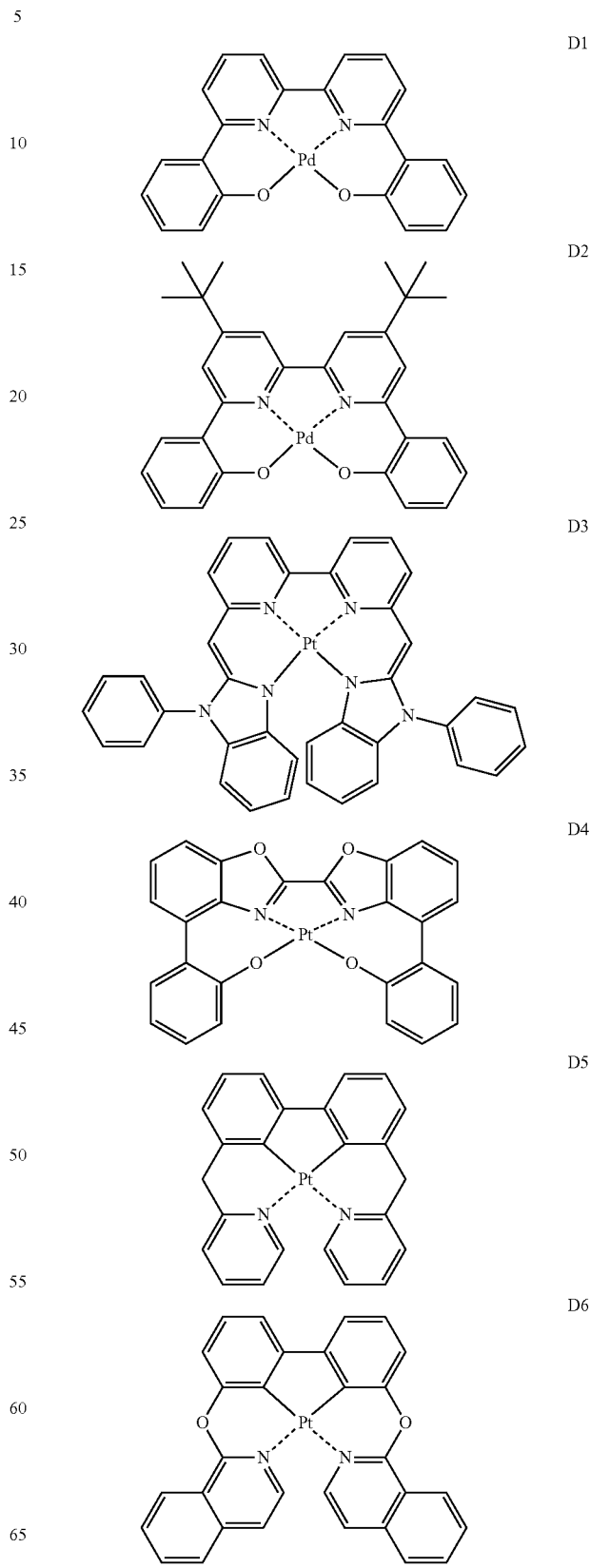
D1
D2
D3
D4
D5
D6

D7
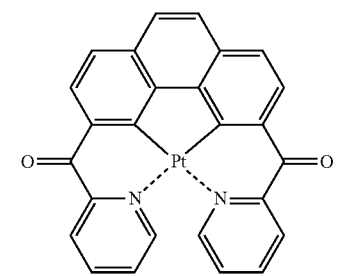
D8
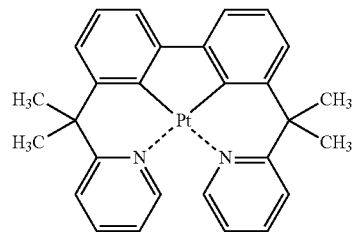
D9
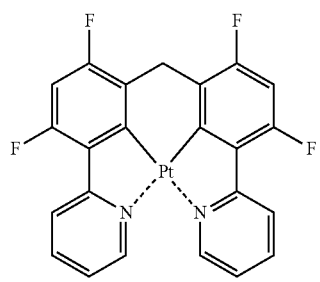
D10
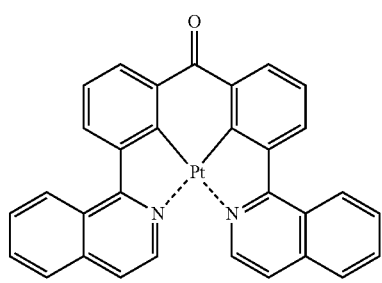
D11
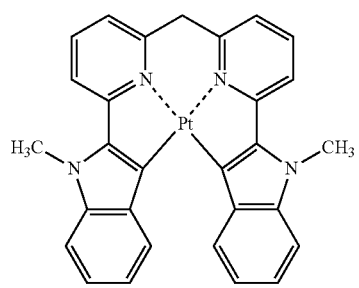
D12
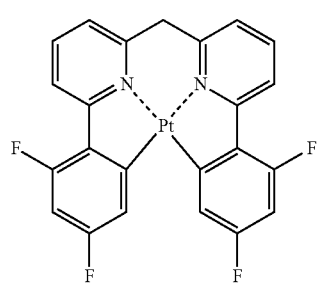
D13
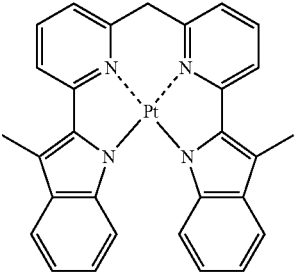
D14
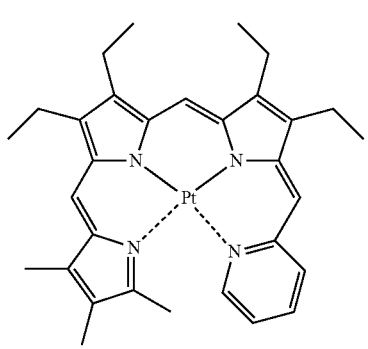
D15
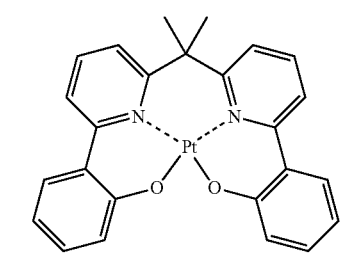
D16
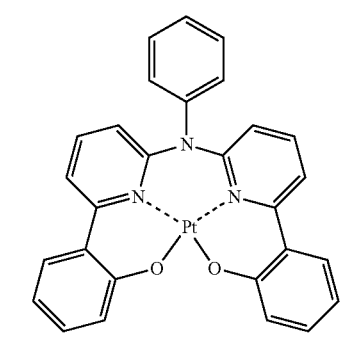
D17
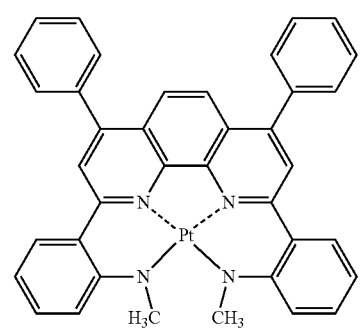

D18
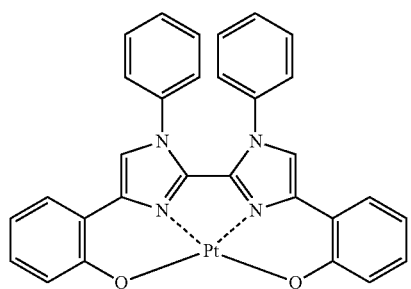
D19
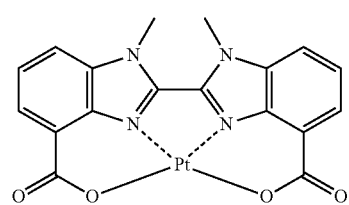
D20
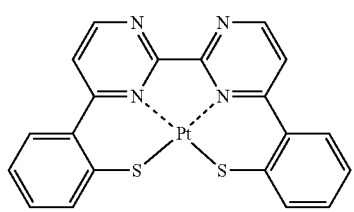
D21
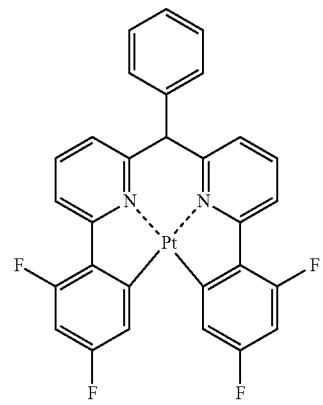
D22
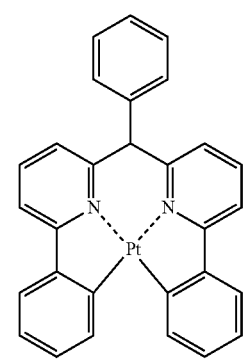
D23
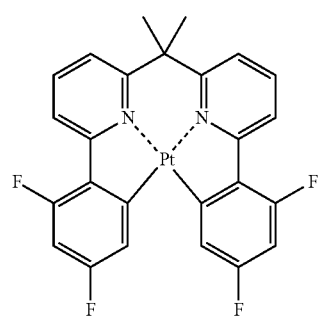
D24
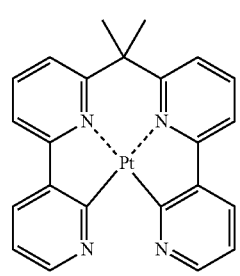
D25
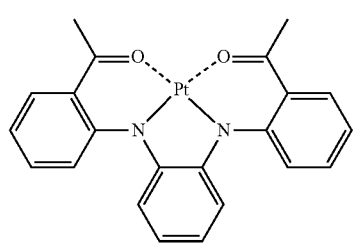
D26
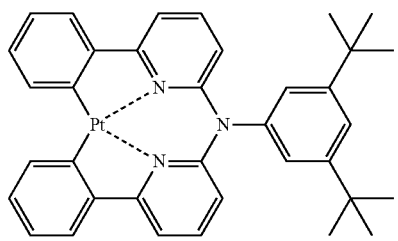
D27
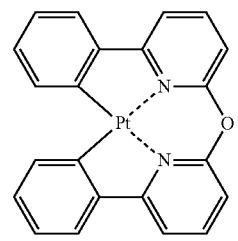
D28
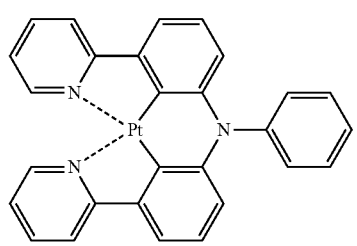

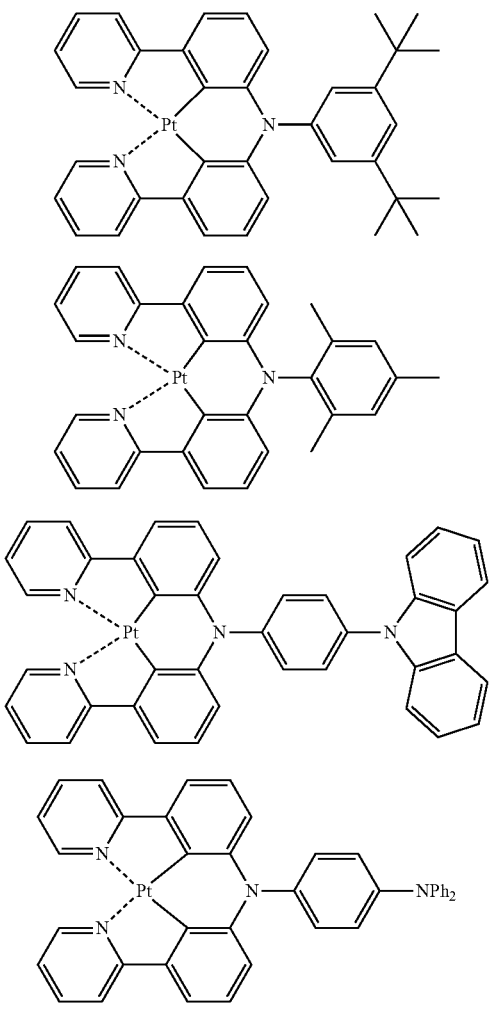
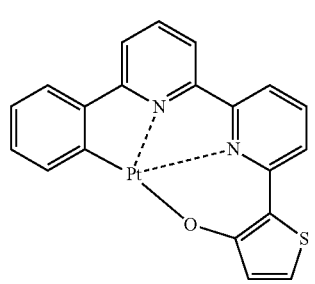
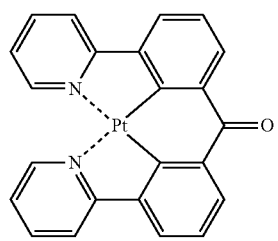
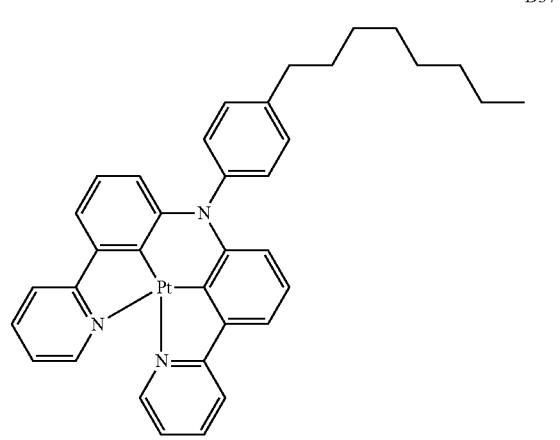
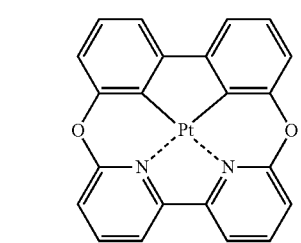
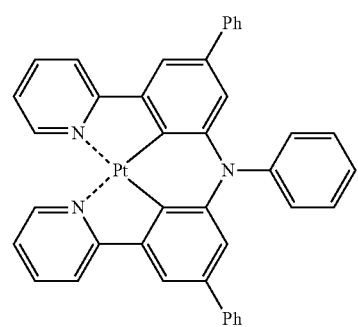
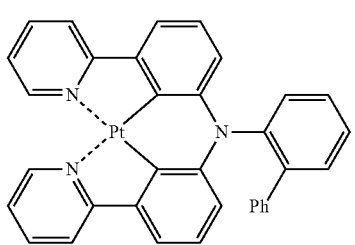

D40 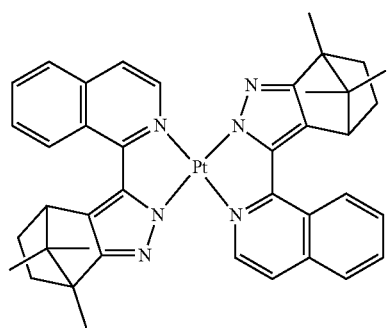
D41 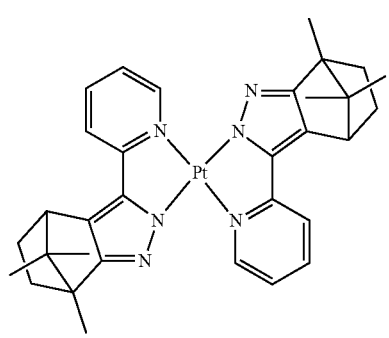
D42 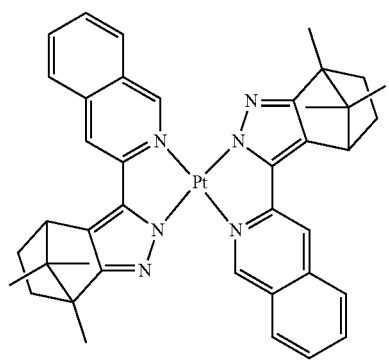
D43 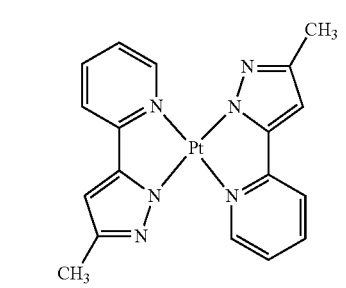
D44 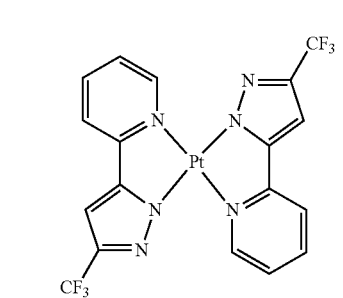
D45 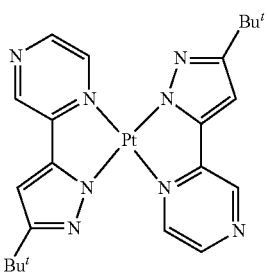
D46 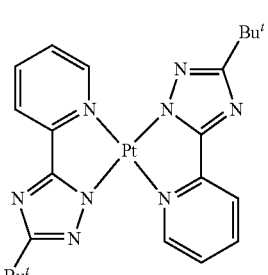
D47 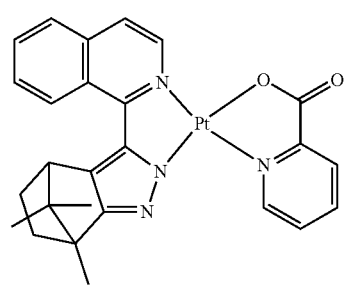
D48 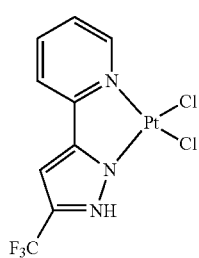
D49 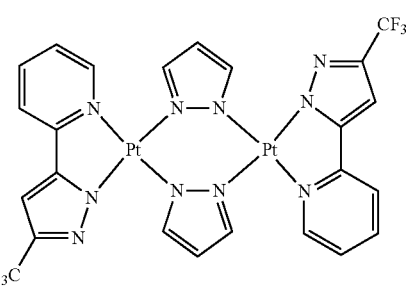

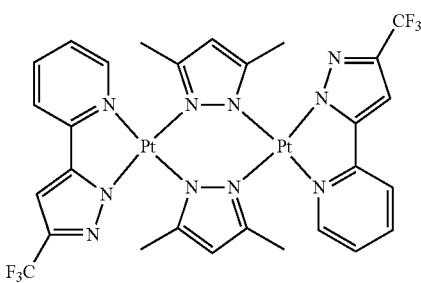

D50

Non-limiting examples of the dopant that may be used in the EML include Os complexes represented by the following formulae.

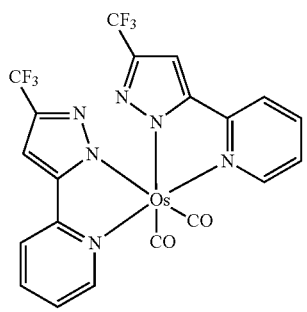

Os(fppz)$_2$(CO)$_2$

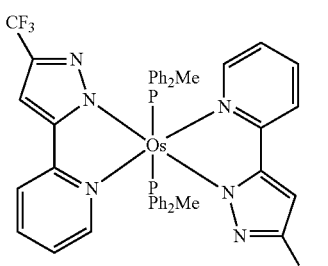

Os(fppz)$_2$(PPh$_2$Me)$_2$

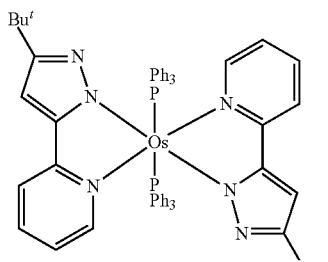

Os(bppz)$_2$(PPh$_3$)$_2$

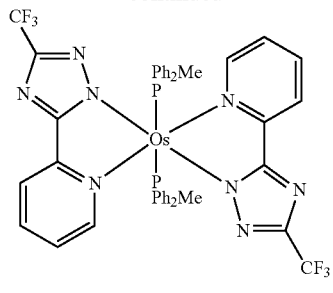

Os(fptz)$_2$(PPh$_2$Me)$_2$

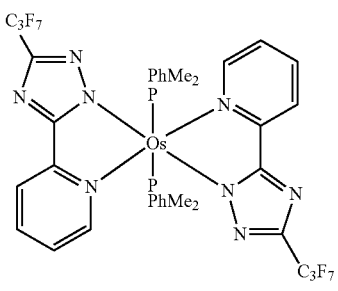

Os(hptz)$_2$(PPh$_2$Me)$_2$

When the EML includes both a host and a dopant, the amount of the dopant may be in a range of about 0.01 to about 15 parts by weight based on 100 parts by weight of the host. However, the amount of the dopant is not limited to the foregoing range.

The thickness of the EML may be in a range of about 100 Å to about 1000 Å, and in some embodiments, in a range of about 200 Å to about 600 Å. When the thickness of the EML is within the foregoing ranges, the EML may have good light emitting ability without a corresponding substantial increase in driving voltage as compared to an EML having a thickness that is not within the foregoing ranges.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL.

A material for forming the ETL may be any known material that can stably transport electrons injected from an electron injecting electrode (cathode). Non-limiting examples of known materials for forming the ETL include a quinoline derivative, such as tris(8-quinolinorate)aluminum (Alq3), TAZ (shown below), BAlq (shown below), beryllium bis(benzoquinolin-10-olate (Bebq$_2$), 9,10-di(naphthalene-2-yl)anthracene (ADN), 2,9-dimethyl-4,7-diphenyl-1,10-phenanthroline (BCP; shown below), Compound 201 (shown below), and Compound 202 (shown below), but the materials for forming the ETL are not limited thereto.

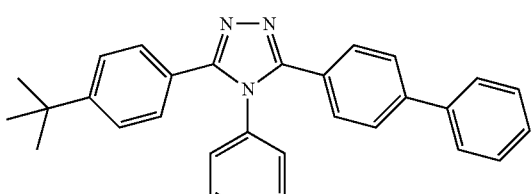

TAZ

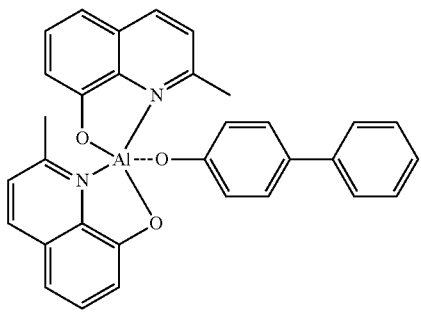

BAlq

<Compound 201>

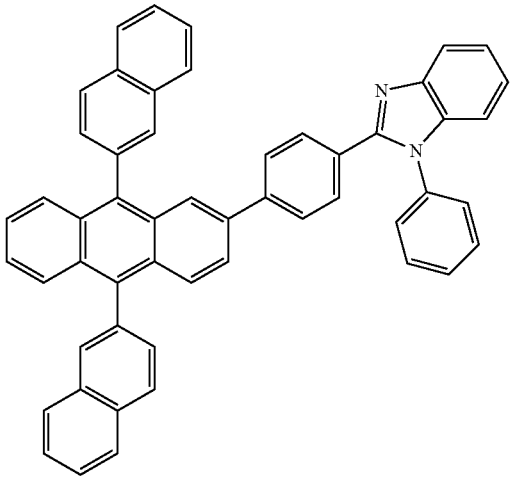

<Compound 202>

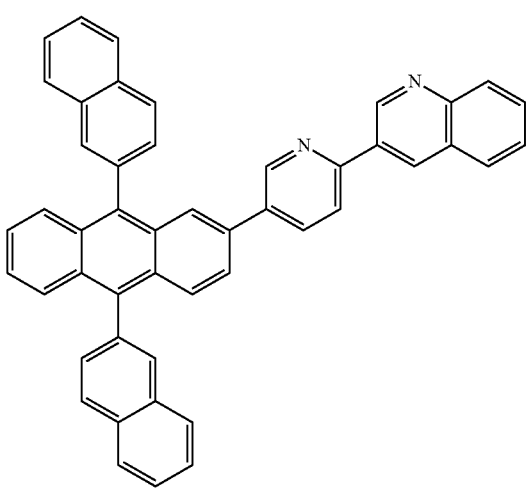

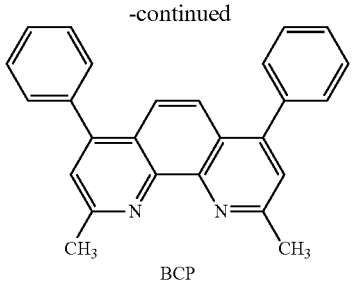

BCP

The thickness of the ETL may be in a range of about 100 Å to about 1000 Å, and in some embodiments, in a range of about 150 Å to about 500 Å. When the thickness of the ETL is within the foregoing ranges, the ETL may have satisfactory electron transporting ability without a corresponding substantial increase in driving voltage as compared to an ETL having a thickness that is not within the foregoing ranges.

In some embodiments the ETL may further include a metal-containing material, in addition to any known electron-transporting organic compound.

The metal-containing material may include a lithium (Li) complex. Non-limiting examples of the Li complex include lithium quinolate (LiQ) and Compound 203 below:

Compound 203

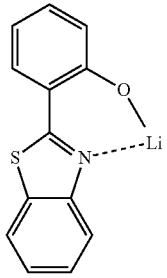

Then, an EIL, which facilitates injection of electrons from the cathode, may be formed on the ETL. Any suitable electron-injecting material, in addition to the compound according to the present invention, may be used to form the EIL.

Non-limiting examples of known materials for forming the EIL include LiF, NaCl, CsF, $Li_2O$, and BaO. The deposition and coating conditions for forming the EIL may be similar to those for the formation of the HIL, though the deposition and coating conditions may vary according to the material that is used to form the EIL.

The thickness of the EIL may be in a range of about 1 Å to about 100 Å, and in some embodiments, in a range of about 3 Å to about 90 Å. When the thickness of the EIL is within the foregoing ranges, the EIL may have satisfactory electron injection ability without a corresponding substantial increase in driving voltage as compared to an EIL having a thickness that is not within the foregoing ranges.

A second electrode is on the organic layer. The second electrode may be a cathode, which is an electron injecting electrode. A metal for forming the second electrode may be a metal, an alloy, an electrically conductive compound, which have a low-work function, or a mixture thereof. In this regard, the second electrode may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be a thin film type transmission electrode. In some embodiments, to manufacture a top-emission light-emitting device, the transmission electrode may be formed of indium tin oxide (ITO) or indium zinc oxide (IZO).

A capping layer (CPL) is deposited on the second electrode, and an inorganic layer and an organic layer are alternately stacked n times on the CPL to complete the formation of a thin film encapsulation layer (TFE) (n may be from 1 to 30, for example, 1 to 20 or 1 to 10). In addition, an outer portion of the thin film encapsulation layer may be an inorganic film or an organic film.

In addition, a CPL protection layer may be deposited between the CPL and the inorganic layer to protect the CPL from the deposition environment of the inorganic layer. The CPL protection layer may be formed of WOx, $TiO_2$, or LiF.

Hereinbefore, the organic light-emitting device has been described with reference to the accompanying drawing, but an organic light-emitting device according to an embodiment of the present invention is not limited thereto.

In addition, when a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent or reduce diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any known hole-blocking material may be used. Non-limiting examples of hole-blocking materials include oxadiazole derivatives, triazole derivatives, and phenanthroline derivatives. For example, 2,9-dimethyl-4,7-diphenyl-1,10-phenanthroline (BCP) may be used as a material for the HBL.

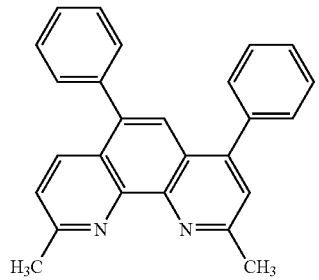

BCP

The thickness of the HBL may be in a range of about 20 Å to about 1000 Å, and in some embodiments, in a range of about 30 Å to about 300 Å. When the thickness of the HBL is within the foregoing ranges, the HBL may have improved hole blocking ability without a corresponding substantial increase in driving voltage as compared to an EIL having a thickness that is not within the foregoing ranges.

According to embodiments of the present invention, the organic light-emitting device may be included in various suitable flat panel display devices, such as in a passive matrix organic light-emitting display device or in an active matrix organic light-emitting display device. In particular, when the organic light-emitting device is included in an active matrix organic light-emitting display device including a thin-film transistor, the first electrode on the substrate may function as a pixel electrode electrically connected to a source electrode or a drain electrode of the thin-film transistor. Moreover, the organic light-emitting device may also be included in flat panel display devices having double-sided screens.

Hereinafter, embodiments of the present invention will be described with reference to the following synthesis examples and other examples. However, these examples are for illustrative purposes only and are not intended to limit the scope of the present invention.

EXAMPLES

Example 1

CPL was deposited on a display unit to have a thickness of 700 Å, and, as a monomer, 20 wt %, 10 wt %, 40 wt %, and 30 wt % monomers of Formulae 10, 20, 30 and 40, respectively, were mixed and a photo initiator (TPO) was added in an amount of 0.5 wt % (based on the total amount of the monomers) to form an organic layer having a thickness of 20000 Å.

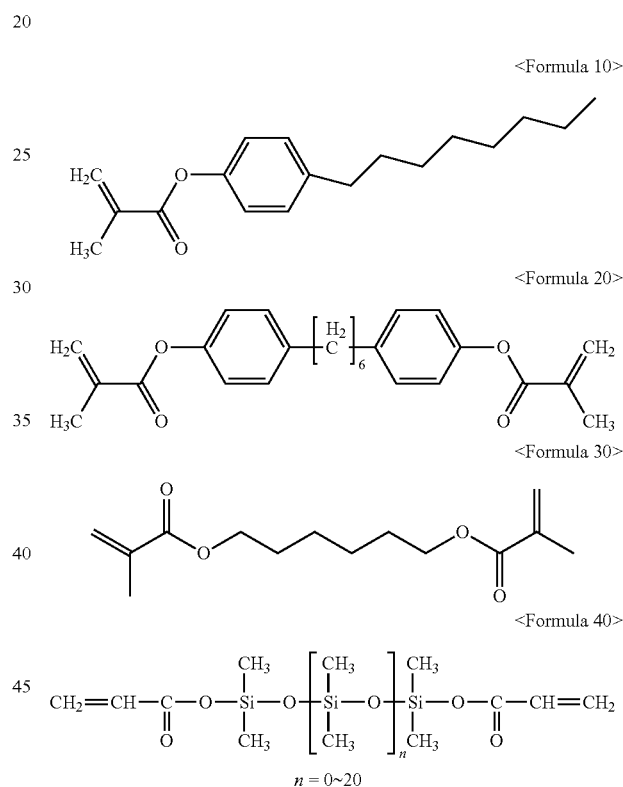

$Al_2O_3$ was sputtered on the organic layer to form an inorganic layer having a thickness of 1000 Å. (In the case of a SiNx inorganic layer, CVD may be used).

The organic layer and the inorganic layer were alternately stacked three times, and as a final layer, $Al_2O_3$ was deposited by sputtering to form an inorganic layer having a thickness of 1000 Å to complete the manufacturing of a thin film encapsulation layer. (The final layer may not necessarily be an inorganic film, and may be the organic film)

Example 2

A CPL was completely formed in the same manner as in Example 1, except that a CPL was deposited on a display unit to have a thickness of 700 Å, and, as monomers, 20 wt %, 10 wt %, 40 wt %, and 30 wt % monomers of Formula 10, Formula 4 (TMPTA), 30 and 40, respectively, were mixed and a photo initiator (TPO) was added in an amount of 0.5 wt % (based on the total amount of the monomers) to form an organic layer having a thickness of 20000 Å.

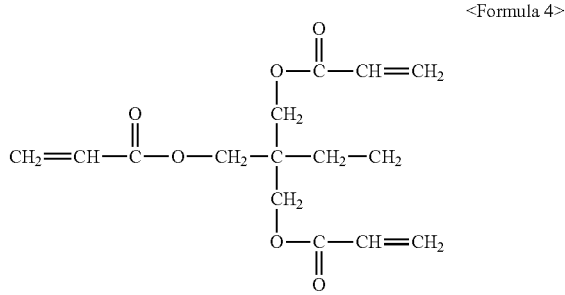 [SMILES: C=CC(=O)OCC(CC)(COC(=O)C=C)COC(=O)C=C]

<Formula 4>

Comparative Example 1

A CPL was formed in the same manner as in Example 1, except that when an organic layer was formed, phenyl methacrylate was used instead of the monomers of Formulae 10, 20, 30 and 40.

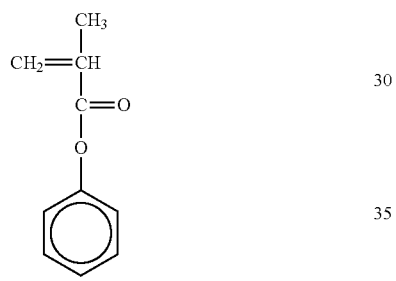

In this experiment, the organic layer was hardly formed, so that the organic layer failed to perform its due function.

Comparative Example 2

A CPL was formed in the same manner as in Example 1, except that when an organic layer was formed, 20 wt %, 50 wt %, 30 wt % monomers of Formulae 50, 30, and 40, respectively, were used instead of the monomers of Formulae 10, 20, 30 and 40.

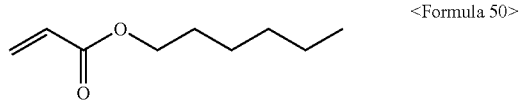

<Formula 50>

Comparison Between Display Units of Examples and Display Units of Comparative Examples An organic light-emitting device including the display units of Comparative Example 2 had about 30 dark spots, and an organic light-emitting device including the display units of Example 1 had only 3 dark spots.

When organic and inorganic films used for thin film encapsulation (TFE) are stacked, plasma used in stacking an inorganic film may damage an organic film and may cause insufficient packing, thereby allowing gas inflow causing defects, such as dark spots. To improve the resistance to damage of the organic film and to prevent or reduce the diffusion and permeation of outgas resulting from the damage, an organic layer including a polymer of monomers of Formulae 1 to 3 is included in an encapsulation layer of an organic light-emitting device, and in the organic light-emitting device, a phenyl ring existing in Formulae 1 to 3 may contribute to an improvement of the resistance to the plasma-induced damage, and due to the presence of chains $X_1$ to $X_5$ of Formulae 1 to 3, packing is enhanced and gas transmissibility decreases. An organic light-emitting device including the organic layer in the encapsulation layer may have a lesser number of dark spots that may occur during reliability tests.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting device comprising:
   a substrate;
   a display unit on the substrate; and
   an encapsulation layer covering the display unit,
   the encapsulation layer having an alternating stack structure of an organic layer and an inorganic layer, and
   the organic layer comprising a polymer polymerized from monomers of Formula 1 and Formula 2 below:

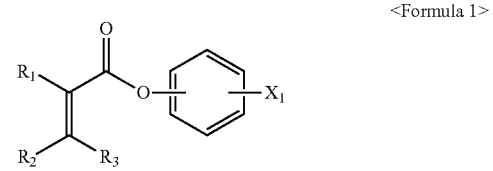

<Formula 1>

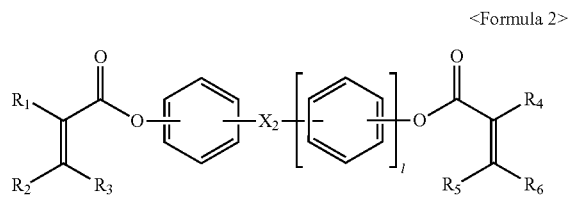

<Formula 2> in Formulae 1 and 2, $R_1$ to $R_6$ are each independently a hydrogen atom, a deuterium atom, or a C1-10 alkyl group, $X_1$ is a C1 to C30 alkyl group, a C6 to C20 aromatic ring-containing C1 to C30 alkyl group, or C6 to C20 cyclicalkyl ring-containing C1 to C30 alkyl group, $X_2$ is a C1 to C30 alkylene group, a C6 to C20 aromatic ring-containing C1 to C30 alkylene group, or C6 to C20 cyclicalkyl ring-containing C1 to C30 alkylene group, and l is 0 or 1.

2. The organic light-emitting device of claim 1, wherein $R_1$ to $R_6$ are each independently a hydrogen atom, a deuterium atom, or methyl.

3. The organic light-emitting device of claim 1, wherein $X_1$ is any one of Formulae 2a to 2e:

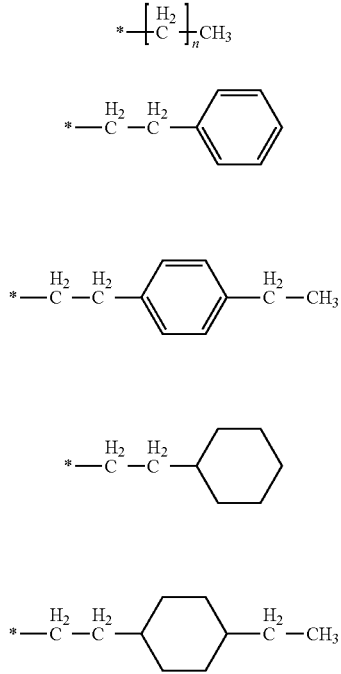

2a

2b

2c

2d

2e wherein n is an integer of 1 to 12, and * represents a bonding site.

4. The organic light-emitting device of claim 1, wherein $X_2$ is any one of Formulae 3a to 3e:

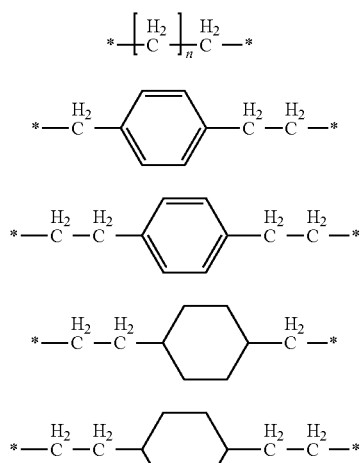

3a

3b

3c

3d

3e wherein n is an integer of 1 to 12, and * represents a bonding site.

5. The organic light-emitting device of claim 1, wherein the polymer of the organic layer is a polymer polymerized from monomers of Formula 1, Formula 2, and Formula 3:

<Formula 3>

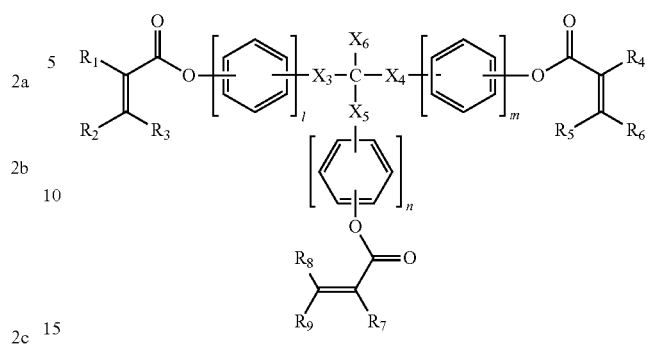

in Formula 3, $R_1$ to $R_8$ are each independently a hydrogen atom, a deuterium atom, or a C1-10 alkyl group, $X_3$ to $X_5$ are each independently a C1 to C30 alkylene group, a C6 to C20 aromatic ring-containing C1 to C30 alkylene group, or C6 to C20 cyclicalkyl ring-containing C1 to C30 alkylene group, $X_6$ is a hydrogen atom, or a C1 to C30 alkyl group, and l, m, and n are each independently 0 or 1.

6. The organic light-emitting device of claim 5, wherein $R_1$ to $R_8$ are each independently a hydrogen atom, a deuterium atom, or a methyl group.

7. The organic light-emitting device of claim 5, wherein $X_3$ to $X_5$ are each independently represented by any one of Formulae 3a to 3h below:

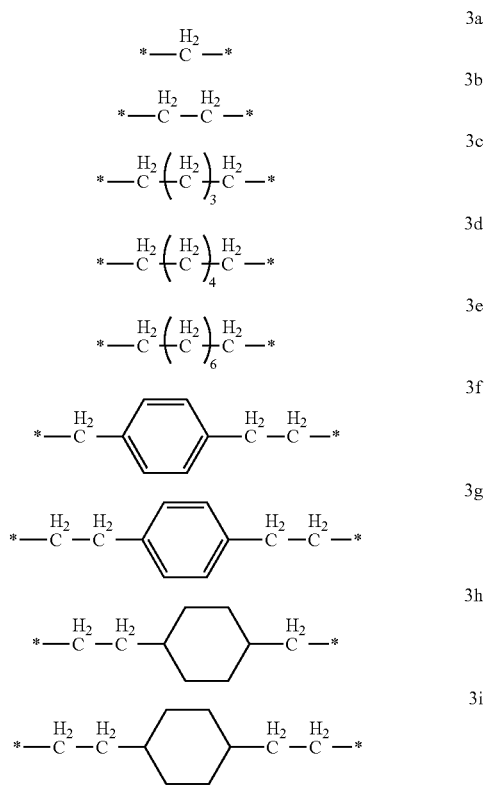

3a

3b

3c

3d

3e

3f

3g

3h

3i wherein * represents a bonding site.

8. The organic light-emitting device of claim 1, wherein the monomer of Formula 1 is represented by Formula 10 below:

<Formula 10>

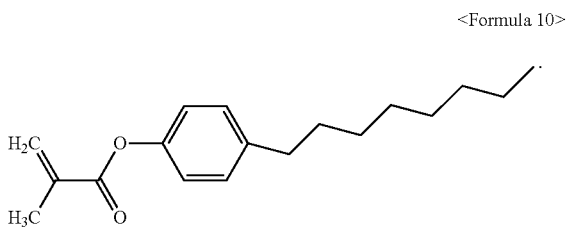 [SMILES: C=C(C)C(=O)Oc1ccc(CCCCCCCC)cc1]

9. The organic light-emitting device of claim 1, wherein the monomer of Formula 2 is represented by Formula 20 below:

<Formula 20>

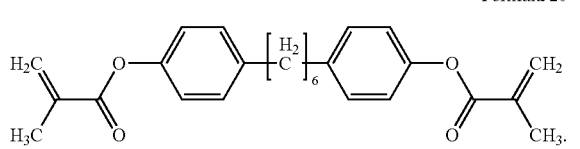

10. The organic light-emitting device of claim 1, wherein the inorganic layer comprises a metal oxide.

11. The organic light-emitting device of claim 1, wherein the display unit comprises one or more layers selected from the group consisting of an emission layer, an electron injection layer, an electron transport layer, a functional layer having electron injection and electron transport abilities, a hole injection layer, a hole transport layer, and a functional layer having hole injection and hole transport abilities, and
the emission layer comprises one or more layers selected from the group consisting of a red layer, a green layer, a blue layer, and a white layer, and any one layer of the red layer, the green layer, the blue layer, and the white layer of the emission layer comprises a phosphorescent compound.

12. The organic light-emitting device of claim 11, wherein at least one of the hole injection layer, the hole transport layer, or the functional layer having hole injection and hole transport abilities comprises a charge generating material.

13. The organic light-emitting device of claim 12, wherein the charge generating material comprises a p-dopant.

14. The organic light-emitting device of claim 13, wherein the p-dopant comprises a quinone derivative.

15. The organic light-emitting device of claim 13, wherein the p-dopant comprises a metal oxide.

16. The organic light-emitting device of claim 13, wherein the p-dopant comprises a cyano group-containing compound.

17. The organic light-emitting device of claim 1, wherein the display unit comprises an electron transport layer, and the electron transport layer comprises a metal complex.

18. The organic light-emitting device of claim 17, wherein the metal complex comprises an Li complex.

19. The organic light-emitting device of claim 18, wherein the metal complex comprises Compound 203

<203>

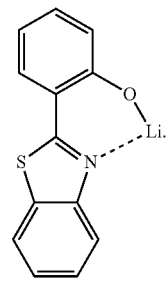

20. A flat panel display device comprising the organic light-emitting device of claim 1, wherein the organic light-emitting device includes a first electrode electrically connected to a source or drain electrode of a thin film transistor.

* * * * *